US011469571B2

(12) United States Patent
Huang et al.

(10) Patent No.: US 11,469,571 B2
(45) Date of Patent: Oct. 11, 2022

(54) FAST PHASE-SHIFT INTERFEROMETRY BY LASER FREQUENCY SHIFT

(71) Applicant: KLA Corporation, Milpitas, CA (US)

(72) Inventors: Haifeng Huang, Livermore, CA (US); Rui-Fang Shi, Cupertino, CA (US); Daniel C. Wack, Fredericksburg, VA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/090,822

(22) Filed: Nov. 5, 2020

(65) Prior Publication Data

US 2021/0159667 A1 May 27, 2021

Related U.S. Application Data

(60) Provisional application No. 62/938,725, filed on Nov. 21, 2019.

(51) Int. Cl.
*G01B 11/02* (2006.01)
*H01S 5/12* (2021.01)
(Continued)

(52) U.S. Cl.
CPC ........ *H01S 5/1246* (2013.01); *G01B 9/02027* (2013.01); *G01B 11/2441* (2013.01); *G01N 21/45* (2013.01); *H01S 3/1062* (2013.01)

(58) Field of Classification Search
CPC . H01S 5/1246; H01S 3/1062; G01B 9/02027; G01B 9/0201; G01B 2290/40;
(Continued)

(56) References Cited

U.S. PATENT DOCUMENTS 6,847,458 B2 1/2005 Freischlad et al.
8,949,057 B1 2/2015 Seong et al.
(Continued)

FOREIGN PATENT DOCUMENTS

JP 2016170160 A 9/2016

OTHER PUBLICATIONS

PCT International Search Report and Written Opinion for International Application No. PCT/US2020/060643 dated Mar. 9, 2021, 8 pages.
(Continued)

*Primary Examiner* — Tarifur R Chowdhury
*Assistant Examiner* — Jonathon Cook
(74) *Attorney, Agent, or Firm* — Suiter Swantz pc llo

(57) ABSTRACT

An acousto-optic modulator (AOM) laser frequency shifter system includes a laser configured to generate an incident beam, a first optical splitter optically coupled to the laser and configured to split the incident beam into at least one portion of the incident beam, at least one phase-shift channel optically coupled to the first optical splitter and configured to generate at least one frequency-shifted beam with an acousto-optic modulator (AOM) from the at least one portion of the incident beam received from the first optical splitter, and a second optical splitter configured to receive the at least one frequency-shifted beam from the at least one phase-shift channel and configured to direct the at least one frequency-shifted beam to an interferometer configured to acquire an interferogram of a sample with the at least one frequency-shifted beam.

24 Claims, 13 Drawing Sheets

(51) Int. Cl.
*H01S 3/106* (2006.01)
*G01B 11/24* (2006.01)
*G01N 21/45* (2006.01)
*G01B 9/02015* (2022.01)

(58) Field of Classification Search
CPC .............. G01B 11/2441; G01N 21/45; G01M 11/0271
See application file for complete search history.

(56) References Cited

U.S. PATENT DOCUMENTS

| | | | |
|---|---|---|---|
| 9,121,684 B2 | 9/2015 | Tang et al. | |
| 10,809,055 B2 | 10/2020 | Huang | |
| 2012/0105854 A1* | 5/2012 | Borri | G01N 21/554 356/445 |
| 2018/0149468 A1 | 5/2018 | Olszak | |
| 2018/0224266 A1 | 8/2018 | Perea et al. | |
| 2018/0246037 A1 | 8/2018 | Diebold et al. | |
| 2019/0101380 A1 | 4/2019 | Abdulhalim et al. | |
| 2019/0301857 A1* | 10/2019 | Cossairt | G01B 9/02007 |
| 2021/0033386 A1 | 2/2021 | Liu et al. | |
| 2021/0123716 A1 | 4/2021 | Huang et al. | |

OTHER PUBLICATIONS

Handbook of Optical Systems, edited by Herbert Gross, vol. 5: Metrology of Optical Components and Systems, Wiley-VCH, 2012, 996 pages.

Kim, J. I. et al., "Ranging with Frequency-Shifted Feedback Lasers: From μm-Range Accuracy to MHz-Range Measurement Rate", Applied Physics B, 122, 295, 2016, 27 pages.

Handbook of Optics, vol. II, 2nd Edition, Chapter 12: Acousto-Optic Devices and Applications, McGraw-Hill, 1995, 70 pages.

Larkin, K.G. et al., "A new seven-sample symmetrical phase-shift algorithm", Proc. SPIE, 1755, 2, 1992, 10 pages.

Bothwell, T. et al., "JILA Srl optical lattice clock with uncertainty of 2×10−18", Metrologia, 56 (2019) 065004, 17 pages.

\* cited by examiner

FAST PHASE-SHIFT INTERFEROMETRY BY LASER FREQUENCY SHIFT

CROSS-REFERENCE TO RELATED APPLICATIONS

The present application claims the benefit under 35 U.S.C. § 119(e) of U.S. Provisional Patent Application Ser. No. 62/938,725, filed Nov. 21, 2019, titled PHASE-SHIFT INTERFEROMETRY BY LASER FREQUENCY SHIFT, naming Haifeng Huang, Rui-Fang Shi, and Dan Wack as inventors, which is incorporated herein by reference in the entirety.

TECHNICAL FIELD

The present invention in general relates to the field of optical metrology, and, more particularly, to a system and method for fast phase-shift interferometry by laser frequency shift.

BACKGROUND

Metrology systems and processes such as optical interferometers and optical wavefront interferometry have been used to measure certain characteristics of samples. Optical wavefront interferometry may include splitting an incident wavefront into two waves or beams: a sample beam used to probe the test optics and carry the wavefront aberration information of the test optics, and a reference beam. The test and reference beams may then be combined together to create an interferogram, or the interference pattern, which is recorded by a two-dimensional sensor. Adjusting for phase shift in the combined test and reference beams, which is proportional to an optical path difference (OPD) between the test and reference beams, may include directly changing an optical path length (OPL). However, as demands for semiconductor devices increase, the need for improved manufacturing equipment characterization capabilities (e.g., such as optical metrology capabilities) will also continue to increase.

As such, it would be advantageous to provide a system and method to remedy shortcomings of the approaches identified above.

SUMMARY

An acousto-optic modulator (AOM) laser frequency shifter system is disclosed, in accordance with one or more embodiments of the present disclosure. In one embodiment, the AOM laser frequency shifter system includes a laser configured to generate an incident beam. In another embodiment, the AOM laser frequency shifter system includes a first optical splitter optically coupled to the laser. In another embodiment, the first optical splitter is configured to split the incident beam into at least one portion of the incident beam. In another embodiment, the AOM laser frequency shifter system includes at least one phase-shift channel optically coupled to the first optical splitter. In another embodiment, the at least one phase-shift channel includes an AOM. In another embodiment, the at least one phase-shift channel is configured to receive the at least one portion of the incident beam. In another embodiment, the AOM is configured to generate at least one frequency-shifted beam from the at least one portion of the incident beam. In another embodiment, the AOM laser frequency shifter system includes a second optical splitter configured to receive the at least one frequency-shifted beam from the at least one phase-shift channel. In another embodiment, the second optical splitter is configured to direct the at least one frequency-shifted beam to an interferometer configured to acquire an interferogram of a sample with the at least one frequency-shifted beam.

A method is disclosed, in accordance with one or more embodiments of the present disclosure. In one embodiment, the method may include, but is not limited to, generating an incident beam with a laser source. In another embodiment, the method may include, but is not limited to, splitting the incident beam into at least one portion of the incident beam with a first optical splitter. In another embodiment, the method may include, but is not limited to, directing the at least one portion of the incident beam into at least one phase-shift channel of an acousto-optic modulator (AOM) laser frequency shifter system with the first optical splitter. In another embodiment, the method may include, but is not limited to, generating at least one frequency-shifted beam from the at least one portion of the incident beam with an AOM in the at least one phase-shift channel of the AOM laser frequency shifter system. In another embodiment, the method may include, but is not limited to, receiving the at least one frequency-shifted beam with a second optical splitter. In another embodiment, the method may include, but is not limited to, directing the at least one frequency-shifted beam via the second optical splitter to an interferometer configured to acquire an interferogram of a sample with the at least one frequency-shifted beam.

A characterization system is disclosed, in accordance with one or more embodiments of the present disclosure. In one embodiment, the characterization system includes an interferometer configured to acquire an interferogram of a sample. In another embodiment, the characterization system includes an AOM laser frequency shifter system optically coupled to the interferometer. In another embodiment, the AOM laser frequency shifter system includes a laser configured to generate an incident beam. In another embodiment, the AOM laser frequency shifter system includes a first optical splitter optically coupled to the laser. In another embodiment, the first optical splitter is configured to split the incident beam into at least one portion of the incident beam. In another embodiment, the AOM laser frequency shifter system includes at least one phase-shift channel optically coupled to the first optical splitter. In another embodiment, the at least one phase-shift channel includes an AOM. In another embodiment, the at least one phase-shift channel is configured to receive the at least one portion of the incident beam. In another embodiment, the AOM is configured to generate at least one frequency-shifted beam from the at least one portion of the incident beam. In another embodiment, the AOM laser frequency shifter system includes a second optical splitter configured to receive the at least one frequency-shifted beam from the at least one phase-shift channel. In another embodiment, the second optical splitter is configured to direct the at least one frequency-shifted beam to the interferometer. In another embodiment, the interferometer is configured to acquire the interferogram of the sample with the at least one frequency-shifted beam.

A method is disclosed, in accordance with one or more embodiments of the present disclosure. In one embodiment, the method may include, but is not limited to, generating an incident beam with a laser source. In another embodiment, the method may include, but is not limited to, splitting the incident beam into at least one portion of the incident beam with a first optical splitter. In another embodiment, the method may include, but is not limited to, directing the at least one portion of the incident beam into at least one phase-shift channel of an AOM laser frequency shifter system with the first optical splitter. In another embodiment, the method may include, but is not limited to, generating at least one frequency-shifted beam from the at least one portion of the incident beam with an AOM in the at least one phase-shift channel of the AOM laser frequency shifter system. In another embodiment, the method may include, but is not limited to, receiving the at least one frequency-shifted beam with a second optical splitter. In another embodiment, the method may include, but is not limited to, directing the at least one frequency-shifted beam via the second optical splitter to an interferometer. In another embodiment, the method may include, but is not limited to, acquiring an interferogram of a sample in the interferometer with the at least one frequency-shifted beam.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Referring in general to FIGS. 1-8C, a system and method for fast phase-shift interferometry by laser frequency shift is described, in accordance with one or more embodiments of the present disclosure.

Embodiments of the present disclosure are directed to performing multiple step (e.g., N≥3) phase-shift interferometry in a time period of a few millisecond (ms) or sub-ms by using acousto-optic modulators (AOM) laser frequency shifters, greatly reducing the influences of thermal drift, mechanical vibration, acoustic noise, and air wiggle. Embodiments of the present disclosure are also directed to reaching an accuracy of phase shift better than $10^{-5}$ wave in a broad wavelength range between deep ultraviolet (DUV) and infrared (IR). Embodiments of the present disclosure are also directed to measuring an optical path difference between the test and reference paths in an interferometer with an accuracy about 1 micron by using laser frequency comb technology such as a frequency-shifted feedback laser.

Metrology systems and processes such as optical interferometers and optical wavefront interferometry have been used to measure certain characteristics of samples. Optical wavefront interferometry may include splitting an incident wavefront into two waves or beams: a sample beam used to probe the test optics and carry the wavefront aberration information of the test optics, and a reference beam. The sample and reference beams may then be combined together to create an interferogram, or the interference pattern, which is recorded by a sensor.

Figure 1:
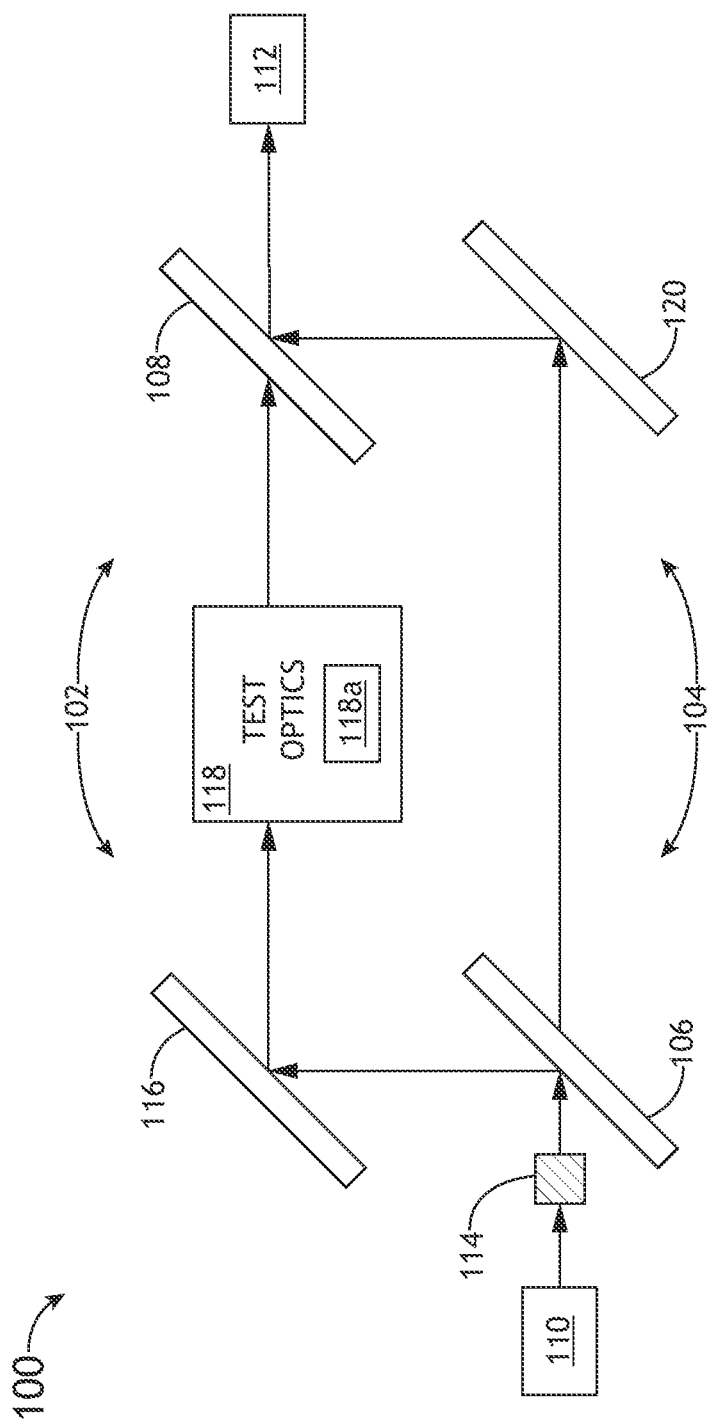
FIG. 1 is a simplified block diagram of an interferometer, in accordance with one or more embodiments of the present disclosure.

FIG. 1 illustrates a simplified schematic of an example interferometer 100 (e.g., a Mach-Zehnder interferometer). In one embodiment, the interferometer 100 includes one or more optical paths. For example, the one or more optical paths include, but are not limited to, a test path 102 and a reference path 104 created by an optical splitter 106. In another embodiment, the test path 102 and the reference path 104 are combined by an optical splitter 108. For example, the optical splitter 106 and/or the optical splitter 108 may include, but are not limited to, a physical fiber splitter, a lens in free space, or the like.

In another embodiment, the interferometer 100 is coupled (e.g., optically, physically, electrically, and/or communicatively) to an illumination source 110. For example, the illumination source 110 may be configured to generate an illumination beam of a selected wavelength. For instance, the illumination source 110 may include, but is not limited to, any source capable of emitting illumination ranging approximately between deep ultraviolet (DUV) (e.g., 157 nanometers (nm)) and mid-infrared (MIR) (e.g., 6000 nm)). By way of another example, the illumination source 110 may include any illumination source known in the art including, but not limited to, a fiber laser, a fiber-coupled light source, a fiber-coupled semiconductor laser, and the like. By way of another example, the illumination source 110 may be coupled to the interferometer 100 via an optical coupler 114.

In another embodiment, the interferometer 100 is coupled (e.g., optically, physically, electrically, and/or communicatively) to a sensor 112. For example, the sensors 112 may be a two-dimensional (2D) sensor 112.

In FIG. 1, the illumination source 110 generates an incident wavefront, which is split by the optical splitter 106 into a sample beam directed into the test path 102 and a reference beam directed into the reference path 104. Within the test path 102, the sample beam is directed by a mirror 116 to test optics 118 and, after passing the test optics 118, carries the wavefront aberration information of the test optics 118 to the optical splitter 108. Within the reference path 104, the reference beam is directed by a mirror 120 to the optical splitter 108.

In another embodiment, the sensor 112 may capture one or more interference patterns between the reference beam of the reference path 104 and the sample beam of the test path 102 (i.e. interferograms). In this regard, the modulated intensity of the interferogram is associated with variations of the optical path of the sample beam. It is noted herein that variations of the optical path may be attributable to variations in height of a sample 118a (e.g. due to the presence of a pattern) or variations in the refractive index along the path of the sample beam. Accordingly, the interference patterns (interferograms) may be indicative of the topology of the sample 118a.

In general, it is noted herein the interferometer 100 is configured to perform measurements on one or both sides of the sample 118a. For example, the interferometer 100 may be configured to perform two-dimensional measurements of a surface of the sample 118a with the sensor 112. By way of another example, the interferometer 100 may include a first interferometer sub-system configured to perform one or more measurements on a first surface of a sample 118a, and a second interferometer sub-system configured to perform one or more measurements on a second surface of the sample 118a opposite the first surface. In another embodiment, the first and second interferometer sub-systems are configured to perform measurements on opposite sides of the sample 118a simultaneously. The first interferometer sub-system and the second interferometer sub-system may be identical, but they need not be identical in all embodiments.

The sample 118a may include any sample known in the art including, but not limited to, a wafer, a semiconductor wafer, a reticle, a mask, and the like. In one embodiment, the sample 118a may be disposed on/within a holding mechanism or a sample stage. For example, the interferometer 100 may include a holding mechanism or a sample stage configured to hold the sample 118a vertically (or substantially vertically), horizontally (or substantially horizontally), and the like.

It is noted herein the test optics 118 may include any number and/or type of optical elements configured to allow for providing a sample beam to the sample 118a (e.g., from the illumination source 110) and receiving illumination deflected from the sample 118a (e.g., to provide to the sensor 112). For example, the one or more optical elements may include, but are not limited to, collimators, lenses, prisms, circularly symmetric lenses, cylindrical lenses, beam shapers, mirrors, waveplates, polarizers, filters, and the like. For instance, the one or more optical elements may include, but is not limited to, an aspherical collimating lens. The one or more optical elements may be configured to modify one or more characteristics of the illumination beam including, but not limited to, a diameter of the illumination beam. In one embodiment, one or more optical elements collimate a diverging illumination beam. In another embodiment, one or more optical elements may be configured to direct and/or focus illumination propagated toward the sensor 112 such that interference fringes are overlaid on an image of the sample 118a. In addition, it is noted herein the sample 118a may be or may be a component of an optical imaging system.

The optical splitter 108 then combines the sample beam and the reference beams together and directs the combined wave to the sensor 112, which records the interference pattern or interferogram. EQ. 1 is the interference equation:

$$I_i = I_t + I_r + 2\sqrt{I_t^* I_r} \cos((\varphi_O + \delta_i))$$ EQ. 1 where $I_t$ and $I_r$ are test and reference beam intensities, respectively. $\varphi_0$ is the phase difference between the two waves, which contains the wavefront aberration information of the test optics and will be measured, $\delta_i$ is the phase shift, with i=1 . . . N and N being the total number of phase-shift steps. For each phase step $\delta_i$, there is a corresponding interferogram intensity $I_i$. When N≥3, the original phase $\varphi_0$, $I_t$, and $I_r$ can be solved. In EQ. 1, the phase $\varphi_0$ is proportional to the optical path difference (OPD) between the test and reference beams, as provided in EQ. 2:

$$\varphi_0 = 2\pi \frac{OPD}{c} v_0$$ EQ. 2 where c is the speed of light in vacuum and OPD is the equivalent optical path difference in vacuum between the two waves, which already includes the effect of material refractive indices in both optical paths. From EQ. 2, it should be understood phase-shift may be realized by changing the laser frequency, instead of or in addition to changing the OPD. EQ. 3 illustrates the determination of each phase step $\delta_i$:

$$\delta_i = 2\pi \frac{OPD}{c} \Delta v_i$$ EQ. 3 where $\Delta v_i$ is the laser frequency shift from $v_o$ for the $i^{th}$ phase shift step. From EQ. 3, it should be understood the method of phase-shift by laser frequency shift works only when the OPD is not zero.

Figure 2A:
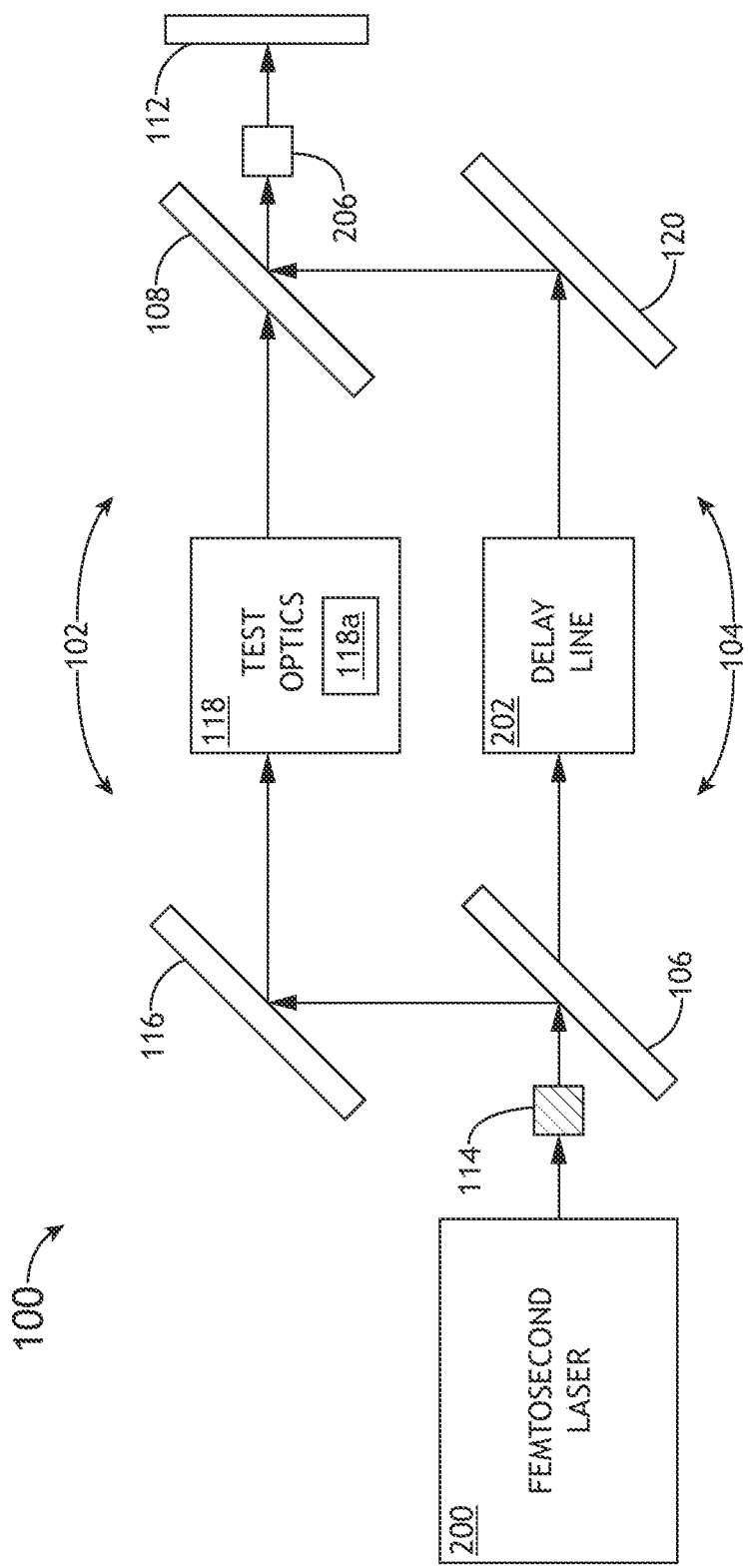
FIG. 2A is a simplified block diagram of an interferometer, in accordance with one or more embodiments of the present disclosure.
Figure 2B:
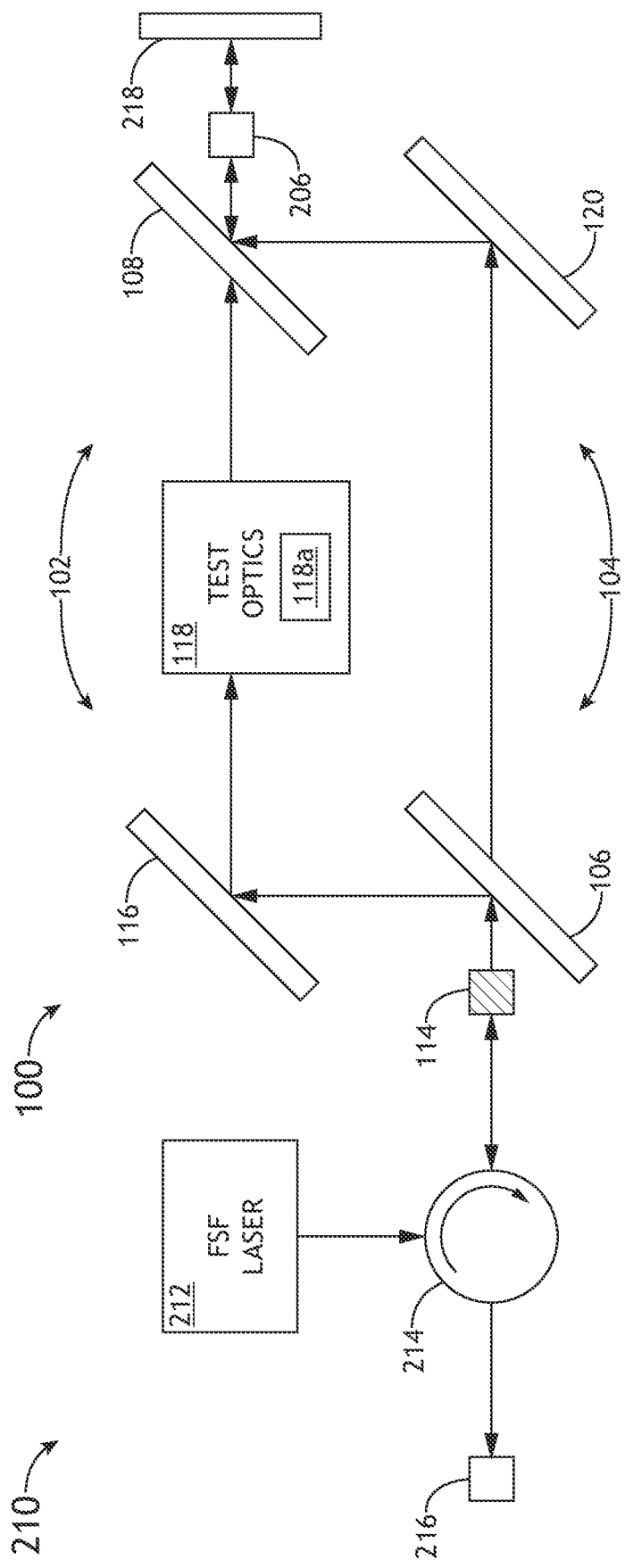
FIG. 2B is a simplified block diagram of an interferometer, in accordance with one or more embodiments of the present disclosure.

Adjusting for phase shift in the combined test and reference beams, which is proportional to the OPD between the test and reference beams, may include directly changing an optical path length (OPL). FIGS. 2A and 2B illustrate simplified schematics of example systems for measuring OPD, in accordance with one or more embodiments of the present disclosure.

It is noted herein additional discussion of a Mach-Zehnder interferometer may be found in the *Handbook of Optical Systems*, edited by Herbert Gross, Volume 5: Metrology of Optical Components and Systems, Wiley-VCH, 2012, which is incorporated herein in the entirety.

Although embodiments of the disclosure illustrate the interferometer 100 as being a Mach-Zehnder interferometer, it is noted herein the term "interferometer 100" should be interpreted as extending to and/or including any type of interferometer known in the art (e.g., a Fizeau interferometer, dual Fizeau interferometer, a shearing interferometer, or the like). In general, the interferometer 100 may be configured to perform surface height measurements and/or surface slope measurements, and that various configurations and components of the interferometer 100 are provided merely for illustration and should not be interpreted as limiting. It is anticipated that a number of equivalent or additional optical configurations may be utilized within the scope of the present disclosure. In this regard, the interferometer 100 may include any number of additional and/or alternative optical elements without departing from the spirit and scope of the present disclosure. For example, the use of Fizeau interferometry for wafer characterization is generally described in U.S. Pat. No. 6,847,458, filed on Mar. 20, 2003; U.S. Pat. No. 8,949,057, filed on Oct. 27, 2011; and U.S. Pat. No. 9,121,684, filed on Jan. 15, 2013, which are each incorporated herein in the entirety. In addition, interferometry systems are further discussed in U.S. Pat. No. 10,809,055, issued on Oct. 20, 2020; and U.S. patent application Ser. No. 16/688,539, filed on Nov. 19, 2019, which are each incorporated herein in the entirety. Therefore, the above description should not be interpreted as a limitation on the scope of the present disclosure but merely an illustration.

In FIG. 2A, in one embodiment the interferometer 100 includes a femtosecond laser 200 coupled (e.g., optically, physically, electrically, and/or communicatively) to the interferometer 100. For example, the femtosecond laser 200 may be coupled to the interferometer 100 via an optical coupler 114. For example, the optical coupler 114 may include, but is not limited to, a physical fiber coupler, a lens in free space, or the like.

In another embodiment, the reference path 104 of the interferometer 100 includes a delay line 202. For example, the delay line 202 may be first tuned to the point at which both the test path 102 and the reference path 104 have the same path length, which will allow the sensor 112 to see interference fringes by the short femtosecond pulses. It is noted the accuracy of this equal OPL point is on the order of tens of microns (μm), limited by the pulse width of the femtosecond laser 200 (e.g., 100 femtoseconds (fs)). By way of another example, the delay line 202 may then be tuned to the point of target OPD (e.g., 1 meter) between both the test path 104 and the reference path 104. It is noted herein that, when necessary, femtosecond laser dispersion capabilities may be added to the test path 102 and/or the reference path 104. In this regard, the OPD may be measured to an accuracy on the order of tens of microns.

In another embodiment, an optical coupler 206 is positioned between the optical splitter 108 and the sensor 112. For example, the optical coupler 206 may include, but is not limited to, a physical fiber coupler, a lens in free space, or the like.

In FIG. 2B, in one embodiment a frequency-shifted feedback (FSF) laser system 210 is coupled to the interferometer 100. In another embodiment, the FSF laser system 210 includes an FSF laser 212, used as a frequency comb laser. For example, the FSF laser 212 may be Ytterbium-fiber based and may work in a near infrared (NIR) region, with a ranging accuracy of approximately one micron, a detection range on the order of 1 meter, and a measurement rate of up to 1 megahertz (MHz).

In another embodiment, the FSF laser 212 is coupled (e.g., optically, physically, electrically, and/or communicatively) to an optical circulator 214. In another embodiment, the optical circulator 214 is coupled (e.g., optically, physically, electrically, and/or communicatively) to the interferometer 100. For example, the optical circulator 214 may be coupled to the interferometer 100 via the optical coupler 114.

In another embodiment, the optical coupler 114 may generate a reference beam by a back reflection of a surface on the optical coupler 114 in addition to transmitting a main beam. For example, the reference beam may pass through the optical circulator 214 to a detector 216.

In another embodiment, the main beam transmitted by the optical coupler 114 is split down the test path 102 (e.g., with the test optics 118) and the reference path 104 via the first optical splitter 106, and is combined with the optical splitter 108 before striking a mirror 218. In another embodiment, the mirror 218 reflects the test beam back down the test path 102 or the reference beam back down the reference path 104, which reaches the detector 216 through the optical coupler 114 and the optical circulator 214.

In another embodiment, the detector 216 measures the beat signal between the reference beam generated by the optical coupler 114 and the beam reflected by the mirror 218 to measure a selected OPL of the test path 102 or a selected OPL of the reference path 104. For example, selecting an OPL may include either blocking the test path 102 to measure the reference path 104 or blocking the reference path 104 to measure the test path 102. In another embodiment, the OPD between the test path 102 and the reference path 104 is calculated after measuring the test path 102 OPL and the reference path 104 OPL separately. For example, the absolute distance between the optical coupler 114 and the mirror 218 through either the test path 102 or the reference path 104 is measured, and the difference determines the OPD.

In another embodiment, the optical coupler 206 is positioned between the optical splitter 108 and the mirror 218. For example, the mirror 218 may be swapped from the interferometer 100 when the FSF laser system 210 is swapped from the interferometer 100.

It is noted herein the OPD measurement laser wavelength may be different from the wavelength used in wavefront metrology. As such, the measured OPD may need to be converted to that of the wavefront metrology wavelength with accurate geometric sizes and refractive indices of the interferometer 100, before using EQ. 3 to calculate the phase shift amount.

In addition, it is noted herein additional discussion about accurate ranging using a FSF laser may be found in "*Ranging with Frequency-Shifted Feedback Lasers: From μm-Range Accuracy to MHz-Range Measurement Rate*", by J. I. Kim et al, Applied Physics B, 122, 295, 2016, which is incorporated herein in the entirety.

Figure 3B:
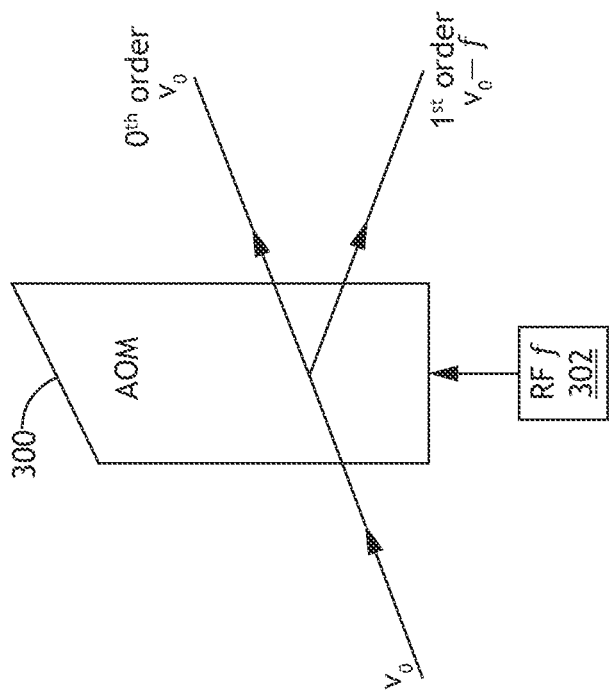
FIG. 3B is a simplified block diagram of an acousto-optic modulator, in accordance with one or more embodiments of the present disclosure.
Figure 3A:
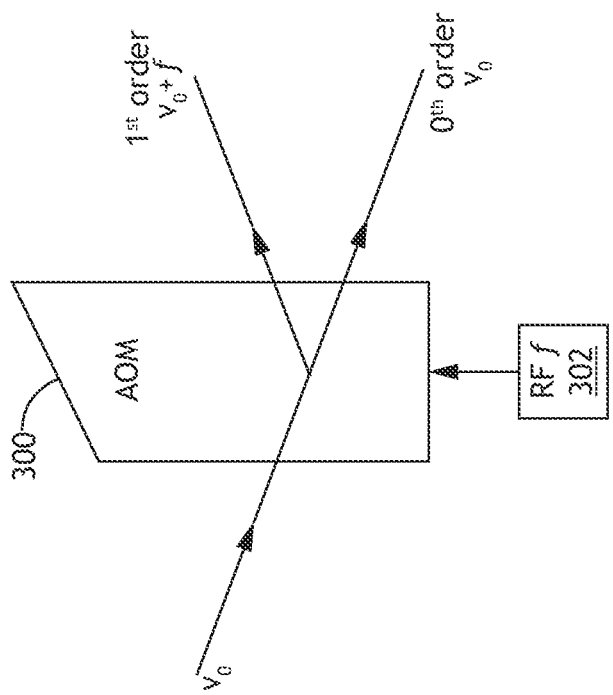
FIG. 3A is a simplified block diagram of an acousto-optic modulator, in accordance with one or more embodiments of the present disclosure.

FIGS. 3A and 3B in general illustrate simplified schematics of an acousto-optic modulator (AOM) 300 for use in phase-shifting, in accordance with one or more embodiments of the present disclosure. An AOM 300 may use a radio frequency (RF) wave f from a wave generator 302 to generate an acoustic wave, which may produce a periodic refractive index pattern along an acoustic wave propagation direction in the AOM crystal. For example, the RF wave f from the wave generator 302 may be tunable. When aligned, incident light with a zeroth-order laser frequency $v_0$ may be deflected from the zeroth-order to a first order direction by Bragg diffraction. For example, depending on the alignment, the first order may either have a laser frequency shift of +f or −f, with f being the RF frequency. When aligned, the diffraction efficiency may be higher than 85% (e.g., in a visible wavelength or in an infrared wavelength).

In one example, where the light beam size is 1 millimeter (mm) and an acoustic wave speed ranges between 3000 and 5000 m/s in the AOM crystal, the on/off speed of the first order beam is less than one microsecond (µs). In this example, the deflection angle between the first order and the transmitted zeroth order beam is about a few degrees of angle in the air, allowing for both orders to be separated.

It is noted herein that although frequency modulation (FM) may also shift laser frequency accurately very fast (e.g., sub-µs ranges), FM generates multiple frequency components at the same time, which are difficult to separate spatially and may not be convenient for phase-shift interferometry application.

In addition, it is noted herein additional discussion about AOM may be found in *Handbook of Optics*, Volume II, 2nd Edition, Chapter 12: ACOUSTO-OPTIC DEVICES AND APPLICATIONS, McGraw-Hill, 1995, which is incorporated herein in the entirety.

Figure 4:
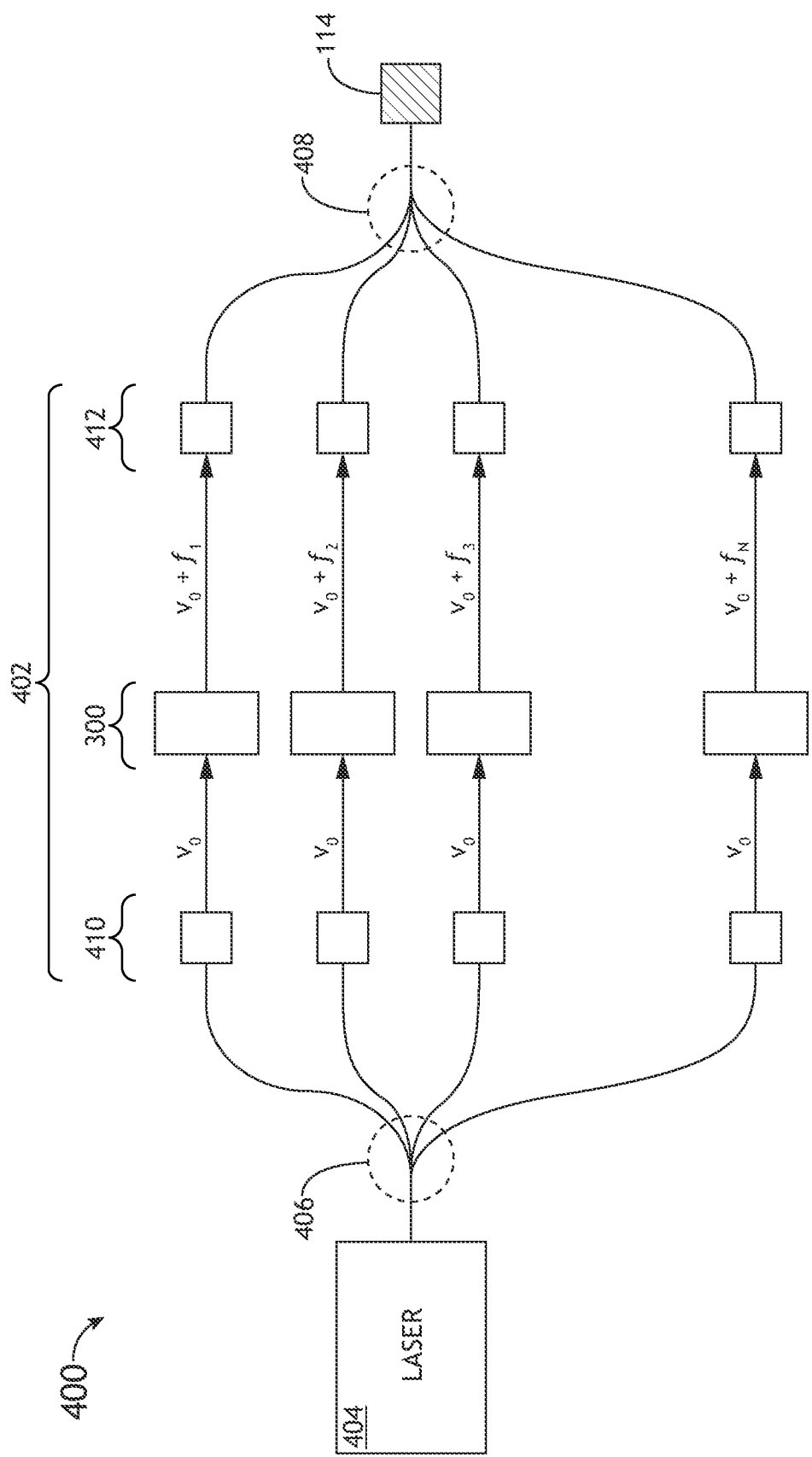
FIG. 4 is a simplified block diagram of an acousto-optic modulator laser frequency shifter system, in accordance with one or more embodiments of the present disclosure.

FIG. 4 illustrates a simplified schematic of a system 400 for phase-shift realization by AOM laser frequency shifters, in accordance with one or more embodiments of the present disclosure. It is noted herein the frequency up-shift mode (e.g., as illustrated in FIG. 3A) is understood for FIG. 4, but that FIG. 4 may be applicable to a frequency down-shift mode (e.g., as illustrated in FIG. 3B).

In another embodiment, the AOM laser frequency shifter system 400 includes one or more phase-shift channels 402, with each phase-shift channel 402 including an AOM 300. For example, the AOM laser frequency shifter system 400 may include a number of phase-shift channels 402 equal to a number of phase-shift steps N. In another embodiment, the laser frequency is shifted by a different RF frequency f by the AOM 300 in each of the one or more phase-shift channels 402, with each of the RF frequency f shifts corresponding to a different phase step. For example, the one or more phase-shift channels 402 may be tunable, as the RF wave f from the wave generator 302 may be tunable. It is noted herein the zeroth-order beams and the RF frequency f waves illustrated in FIGS. 3A and 3B have been removed from FIG. 4, for purposes of clarity.

In one embodiment, the AOM laser frequency shifter system 400 includes a laser 404 configured to generate an incident beam with a zeroth-order laser frequency $v_0$. For example, the laser 404 may be, but is not limited to, a continuous wave (CW) laser. In another embodiment, the AOM laser frequency shifter system 400 includes an optical splitter 406 configured to split the optics from the laser 404 to the one or more phase-shift channels 402. In another embodiment, the AOM laser frequency shifter system 400 includes an optical splitter 408 configured to combine the one or more optics from the one or more phase-shift channels 402. For example, the optical splitter 406 and/or the optical splitter 408 may include, but is not limited to, a physical fiber combiner, a lens in free space, or the like.

In another embodiment, each of the one or more phase-shift channels 402 includes an optical coupler 410 between the optical splitter 406 and a channel-specific AOM 300. In another embodiment, each the one or more phase-shift channels 402 includes an optical coupler 412 between the channel-specific AOM 300 and the optical splitter 408. For example, the optical coupler 410 and/or the optical coupler 412 may include, but is not limited to, a physical fiber coupler, a lens in free space, or the like.

In another embodiment, where there are multiple phase-shift channels 402, only one AOM 300 is active at a time to generate its particular first-order diffraction for that AOM 300, such that only the corresponding phase-shift channel 402 is active and coupled to an optical coupler 114 leading to a downstream application. In another embodiment, the laser beams in the other phase-shift channels 402 are in the zeroth-order at this time and not deflected, meaning they are not coupled to the optical coupler 114 leading to the downstream application. In another embodiment, the on/off sequence of switching between AOM 300 (and thus the corresponding phase-shift channels 402) is controlled through the very fast on/off toggling of the driving RF waves using pulsed RF technology, on the order of microseconds. Therefore, by using pulsed RF technology in the AOM laser frequency shifter system 400, one can perform multiple-step phase shift processes in optical interferometry in a time period of ms or even sub-ms.

In one non-limiting example, for a wavelength of 633 nm, $v_0$ is $4.7 \times 10^{14}$ Hz. If OPD=1 meter, the laser frequency $v_0$ needs to be shifted by an f of about 300 MHz to realize a phase shift of $2\pi$. If the measured OPD is accurate to 30 µm, a phase shift of $2\pi$ will be accurate to the level of $10^{-5}$ wave if the laser linewidth is a few kilohertz (kHz).

It is noted herein that typical phase-shift steps are equally distributed in the range from 0 to $2\pi$ in phase-shift interferometry. For example, a 6+1 symmetrical phase-shift algorithm uses a step of $\pi/3$ and has 7 steps. A discussion of a 6+1 symmetrical phase-shift algorithm may be found in K. G. Larkin and B. F. Oreb, "*A new seven-sample symmetrical phase-shift algorithm*", Proc. SPIE, 1755, 2, 1992, which is incorporated herein in the entirety.

With OPD=1 meter, the 6+1 symmetrical phase-shift algorithm may correspond to a laser frequency shift sequence of 0, 50, 100, 150, 200, 250, and 300 MHz, and the AOM laser frequency shifter system 400 may include six phase-shift channels 402 (or seven if the 0 MHz no-shift is also given a channel). The phase-step accuracy of all steps is better than the $10^{-5}$ wave. It is noted herein the driving RF frequency may be controlled to an accuracy of Hz level, such that the phase-shift error from RF frequency error is negligible. In this regard, such a high phase step accuracy cannot be realized by traditional ways of changing OPL, (e.g. by a high-lead-containing piezoelectric ceramic including, but not limited to, PZT). In a case where OPD is not accurately known (e.g., only known to 1 mm level of OPD=1 m), it is noted herein one may tune the RF frequencies of AOM channels to realize the $\pi/3$ equally separated, 0 to $2\pi$ range 6+1 symmetrical phase-shift process.

The alignment between the incident laser and an AOM depends on the driving RF frequency f. For example, the laser incident angle in each AOM matches the Bragg's diffraction condition of the AOM for the highest diffraction efficiency. As such, when the RF frequency f changes from 50 MHz to 300 MHz, the multiple phase-shift channels 402 are required to realize a high diffraction efficiency, as a single phase-shift channel 402 would require considerable alignment and realignment of the AOM 300.

It is noted herein the total phase shift may be distributed at even intervals between the phase-shift channels 402, such that the number of phase-shift channels 402 may be equal to a divisible number of the total phase shift (e.g., 0-300 MHZ may include 7 channels with an even distribution of 50 MHz, meaning each subsequent channel has a shift f of 50 MHz above the previous channel to produce the 0, 50, 100, 150, 200, 250, and 300 MHz channels). In addition, it is noted herein the total phase shift may be distributed at uneven intervals between the phase-shift channels 402.

Figure 5A:
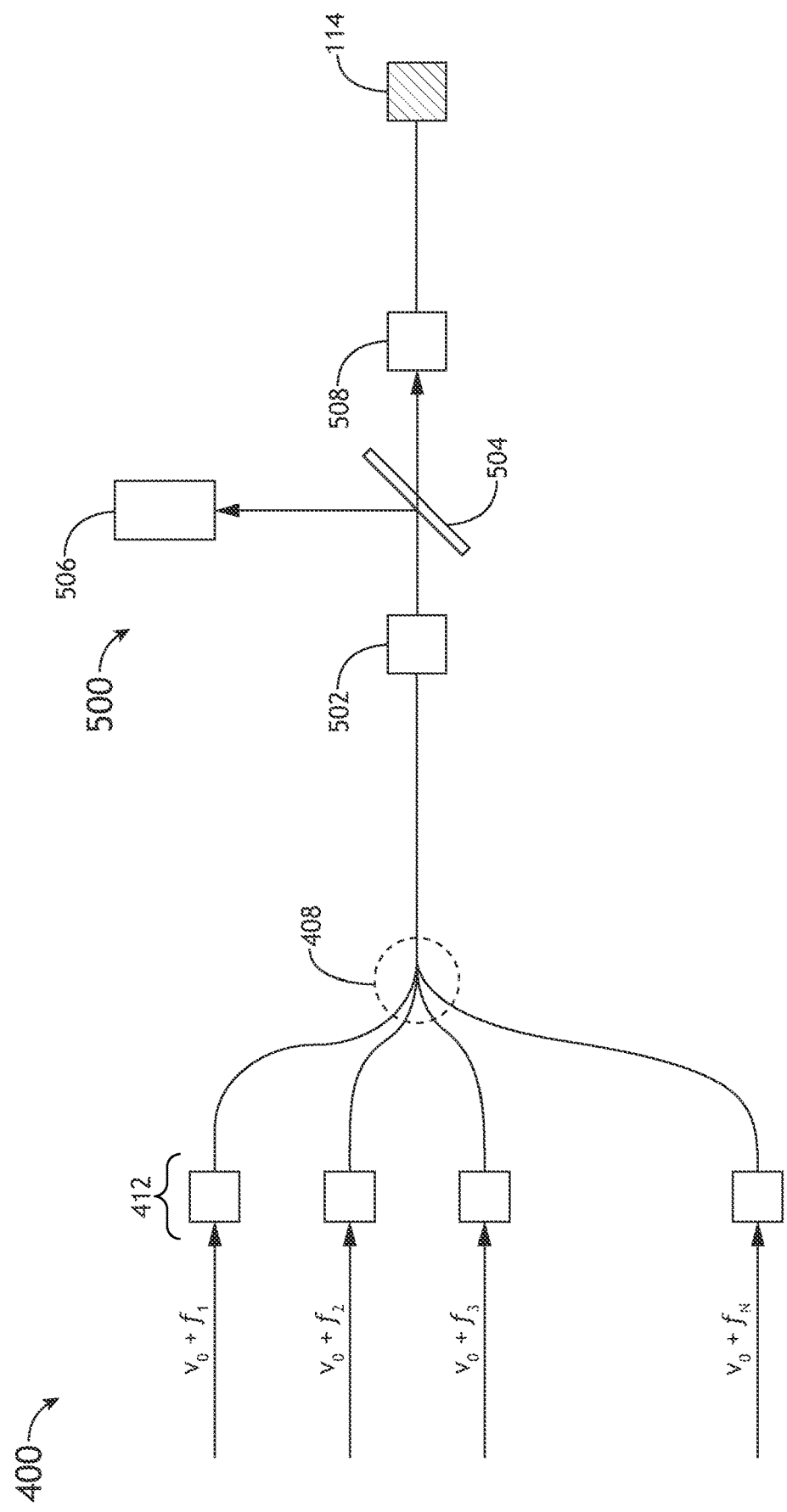
FIG. 5A is a simplified block diagram of an acousto-optic modulator laser frequency shifter system, in accordance with one or more embodiments of the present disclosure.
Figure 5B:
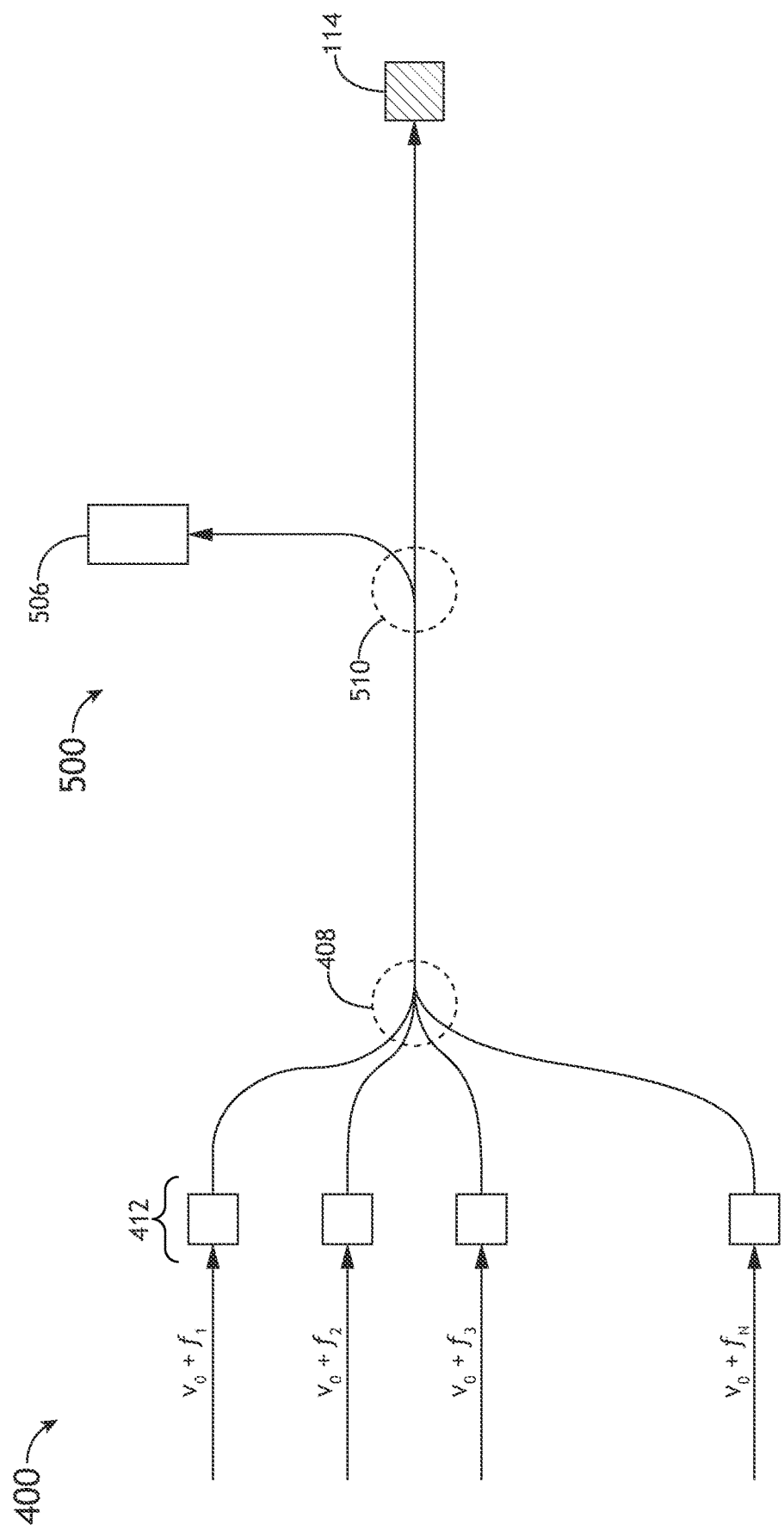
FIG. 5B is a simplified block diagram of an acousto-optic modulator laser frequency shifter system, in accordance with one or more embodiments of the present disclosure.

In phase-shift interferometry, it is critical to keep the intensities of the test path 102 and the reference path 104 constant when performing phase-shift processes. With the multiple-channel 402 design of FIG. 4, light intensity change may be corrected by inserting a reference director into the optical line. FIGS. 5A and 5B in general illustrate simplified schematic of a subsystem 500 for the AOM laser frequency shifter system 400, in accordance with one or more embodiments of the present disclosure.

In one example subsystem 500 as illustrated in FIG. 5A, the optical splitter 408 leads to an optical coupler 502 of the subsystem 500. The optical coupler 502 leads to an optical splitter 504, which leads to a reference detector 506 and an optical coupler 508. For example, the optical coupler 502 and/or the optical coupler 508 may include, but is not limited to, a physical fiber coupler, a lens in free space, or the like. The optical coupler 508 leads to the optical coupler 114. It is noted herein FIG. 5A illustrates a free-space optical system In another example subsystem 500 as illustrated in FIG. 5B, the optical splitter 408 leads to the reference detector 506 and the optical coupler 114 via an optical splitter 510, without the need for the optical coupler 502, the optical splitter 504, and/or the optical coupler 508. It is noted herein FIG. 5B illustrates an optical fiber variant of FIG. 5A.

The reference detector 506 may monitor and correct for power fluctuations in the incident beam, allowing for a stability of $I_t$ and $I_r$ to be better than 0.1% without considerable effort. It is noted herein, however, the reference detector 506 may need a large enough bandwidth to reduce the signal transition time as much as possible during RF on/off for a fast phase-shift, and to correctly record incident beam power fluctuation.

In another embodiment, the one or more AOM 300 and/or the one or more phase-shift channels 402 including the one or more AOM 300 may be controlled via a controller (e.g., a controller 702, as described in detail further herein). For example, the controller may determine which AOM 300, which phase-shift channel 402, and/or which wave generator 302 is on. By way of another example, the controller may adjust the RF wave f from the wave generator 302. It is noted herein, however, the one or more AOM 300, the one or more phase-shift channels 402, and/or the wave generator 302 may be manually controlled or adjusted. Therefore, the above description should not be interpreted as a limitation on the scope of the present disclosure but merely an illustration.

Figure 6:
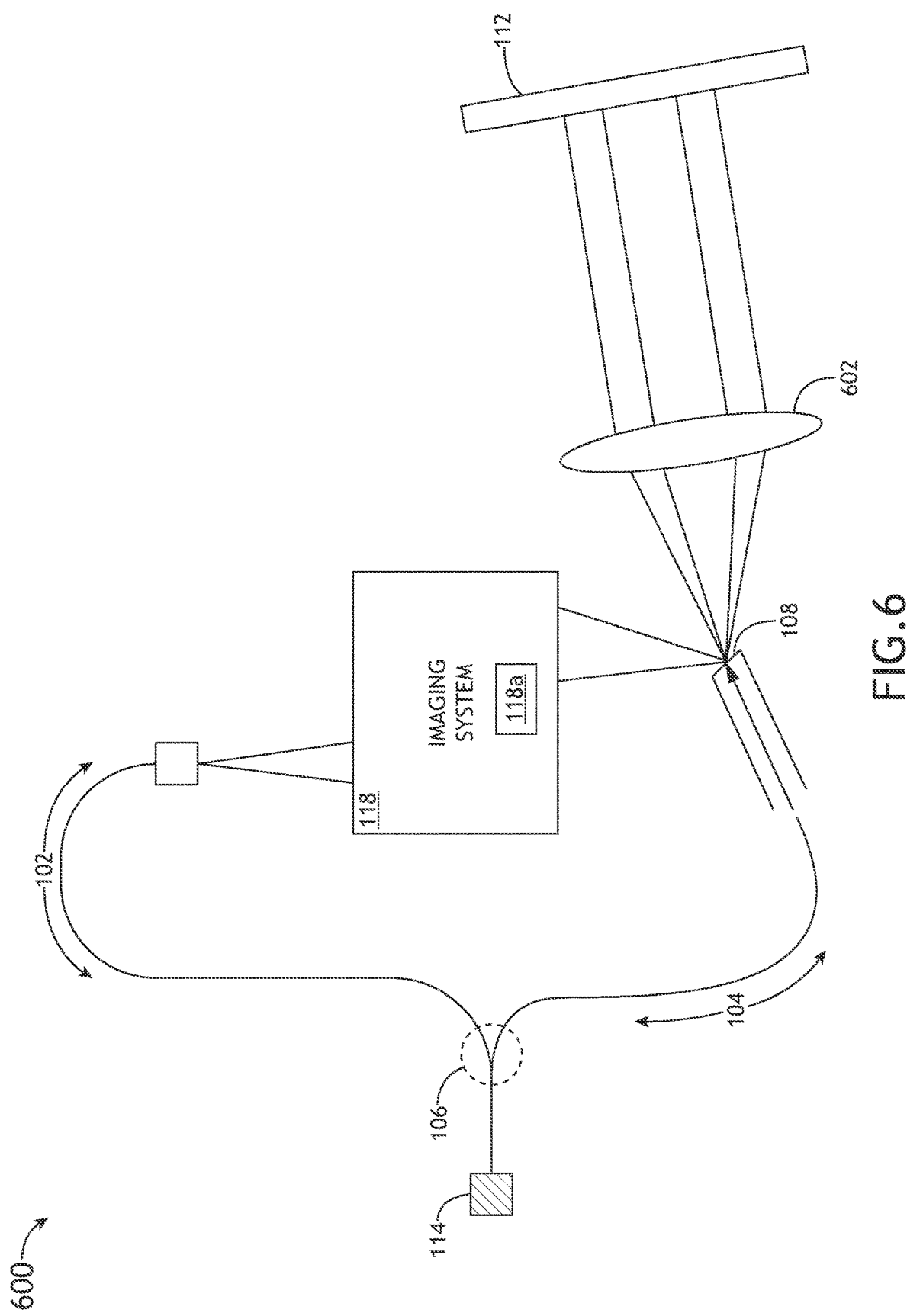
FIG. 6 is a simplified block diagram of an interferometer, in accordance with one or more embodiments of the present disclosure.

FIG. 6 illustrates a simplified schematic of an interferometer 600, in accordance with one or more embodiments of the present disclosure. For example, the interferometer 600 may include, but is not limited to, a common path mode fiber tip diffraction interferometer (FTDI).

In one embodiment, the interferometer 600 includes one or more optical paths. For example, the one or more optical paths include, but are not limited to, a test path 102 and a reference path 104 created by an optical splitter 106. In another embodiment, the interferometer 600 uses linear polarization light (e.g., s-polarization) for a select level of interferogram contrast, via control of light intensities of the test path 102 and/or the reference path 104. In another embodiment, the interferometer 600 uses polarization-maintained (PM) optical fiber to couple components. It is noted herein, however, at least some of the components of the interferometer 600 may be arranged in free space.

In another embodiment, the interferometer 600 includes the optical coupler 114. For example, the incoming beam may be received via the optical coupler 114. In another embodiment, the test path 102 and the reference path 104 are combined with the optical splitter 108.

In another embodiment, the test path 102 includes the test optics 118. In another embodiment, the test path 102 includes a fiber tip or pinhole diffraction leading to the test optics 118 from the optical splitter 106 (e.g., depending on whether the interferometer 600 includes components coupled via fiber optics or includes components arranged in free space). In another embodiment, the test optics 118 lead to the optical splitter 108.

In another embodiment, the reference path 104 may include a fiber tip with the optical splitter 108 (e.g., where the interferometer 600 includes components coupled via fiber optics). It is noted herein, however, the optical splitter 108 may be independent of the test path 102 and/or the reference path 104 (e.g., where the interferometer 600 includes components arranged in free space). It is noted herein reflections from the reference path 104 and transmissions from the test path 102 by the optical splitter 108 are not illustrated for purposes of clarity.

In another embodiment, the interferometer 600 is coupled to the sensor 112. For example, the optical splitter 108 of the interferometer 600 may lead to the sensor 112.

In another embodiment, one or more optical elements 602 are positioned in-line between the optical splitter 108 and the sensor 112. For example, the one or more optical elements 602 may include, but are not limited to, collimators, lenses, prisms, and the like. For instance, the one or more optical elements 602 may include, but is not limited to, an aspherical collimating lens. In another embodiment, one or more optical elements 602 are configured to direct, modify, and/or focus illumination propagated toward the sensor 112.

In addition, it is noted herein any embodiments directed to the components illustrated in FIGS. 1, 2A, and 2B can be directed to the components illustrated in FIG. 6. Therefore, the above description should not be interpreted as a limitation on the scope of the present disclosure but merely an illustration.

It is noted herein additional discussion about FTDI may be found in U.S. patent application Ser. No. 16/818,050, filed on Mar. 13, 2020, which is incorporated herein in the entirety.

In another embodiment, EQ. 2 as provided above sets a requirement of the linewidth of the measurement laser for the interferometer 600. For example, reaching an accuracy of 1 millirad (mrad) RMS in $\varphi_0$ measurement, which is about 0.1 nm RMS wavefront error for 633 nm light, may require the laser linewidth to be less than 48 kHz where OPD=1 m, which gives a coherence length of 6.3 kilometers (km). To reach the $10^{-5}$ wave accuracy of phase-shift steps with an OPD of 1 m, then, the laser linewidth may need to be as low as a few kHz. Laser frequency metrology community has shown that kHz level linewidth is easy to reach by laser frequency stabilization technologies. The world record of laser frequency measurement accuracy is on the order of $10^{-18}$. It is noted herein additional discussion about kHz-level linewidth may be found in T. Bothwell et al., "*JILA SrI*

*optical lattice clock with uncertainty of* $2 \times 10^{-18}$", Metrologia, 56 (2019) 065004, which is incorporated herein in the entirety.

Although embodiments of the disclosure illustrate the interferometer 600 as being an FTDI, it is noted herein the term "interferometer 600" should be interpreted as extending to and/or including any type of interferometer known in the art (e.g., a Fizeau interferometer, dual Fizeau interferometer, a shearing interferometer, or the like). In general, the interferometer 600 may be configured to perform surface height measurements and/or surface slope measurements, and that various configurations and components of the interferometer 600 are provided merely for illustration and should not be interpreted as limiting. It is anticipated that a number of equivalent or additional optical configurations may be utilized within the scope of the present disclosure. In this regard, the interferometer 600 may include any number of additional and/or alternative optical elements without departing from the spirit and scope of the present disclosure. For example, the use of Fizeau interferometry for wafer characterization is generally described in U.S. Pat. No. 6,847,458, filed on Mar. 20, 2003; U.S. Pat. No. 8,949,057, filed on Oct. 27, 2011; and U.S. Pat. No. 9,121,684, filed on Jan. 15, 2013, which are each incorporated herein in the entirety. In addition, interferometry systems are further discussed in U.S. Pat. No. 10,809,055, issued on Oct. 20, 2020; and U.S. patent application Ser. No. 16/688,539, filed on Nov. 19, 2019, which are each incorporated herein in the entirety. Therefore, the above description should not be interpreted as a limitation on the scope of the present disclosure but merely an illustration.

It is noted herein any optical splitters 106, 108 illustrated in FIGS. 1-2B and/or optical splitters 406, 408 illustrated in FIGS. 4A-6 may be considered optical combiners, depending on the direction of the various beams described through the disclosure as being configured to pass through and/or be generated by the interferometer 100, the AOM laser frequency shifter system 400, and/or the interferometer 600. Therefore, the above description should not be interpreted as a limitation on the scope of the present disclosure but merely an illustration.

Figure 7A:
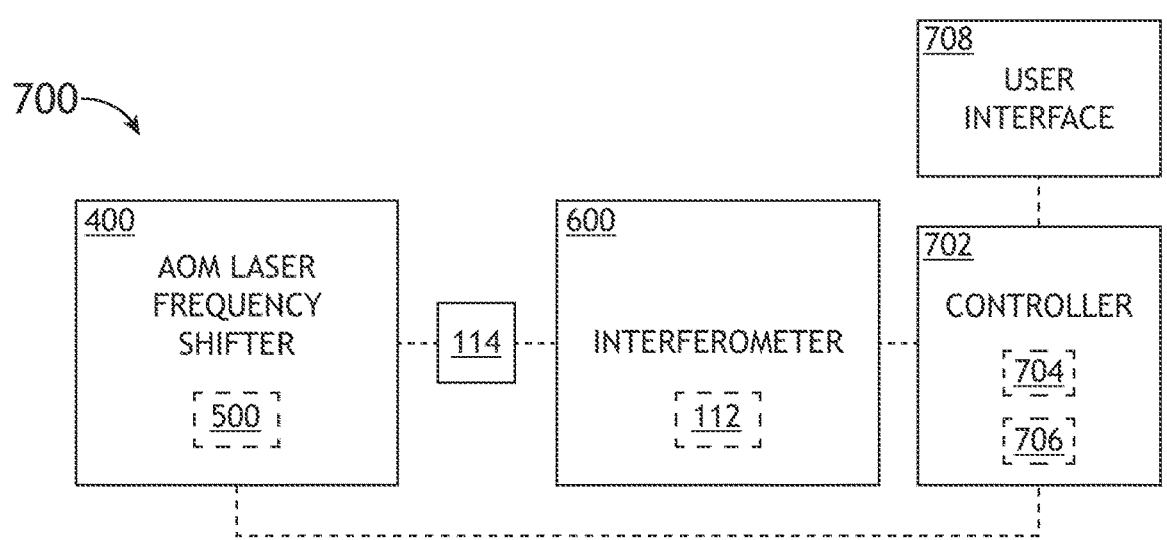
FIG. 7A is a simplified block diagram of a characterization system including an interferometer and an acousto-optic modulator laser frequency shifter system, in accordance with one or more embodiments of the present disclosure.
Figure 7B:
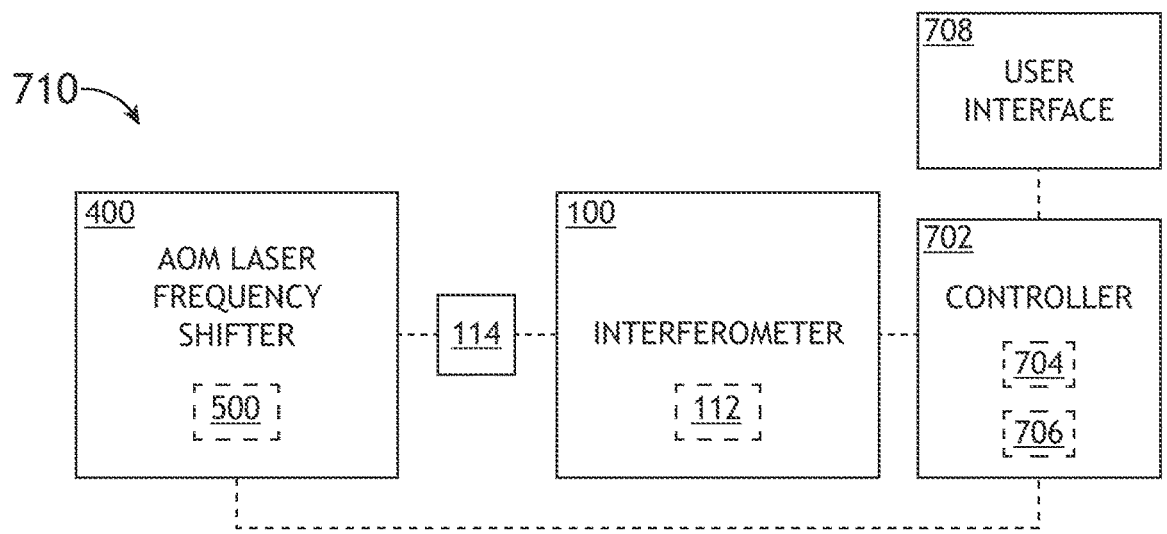
FIG. 7B is a simplified block diagram of a characterization system including an interferometer and an acousto-optic modulator laser frequency shifter system, in accordance with one or more embodiments of the present disclosure.
Figure 7C:
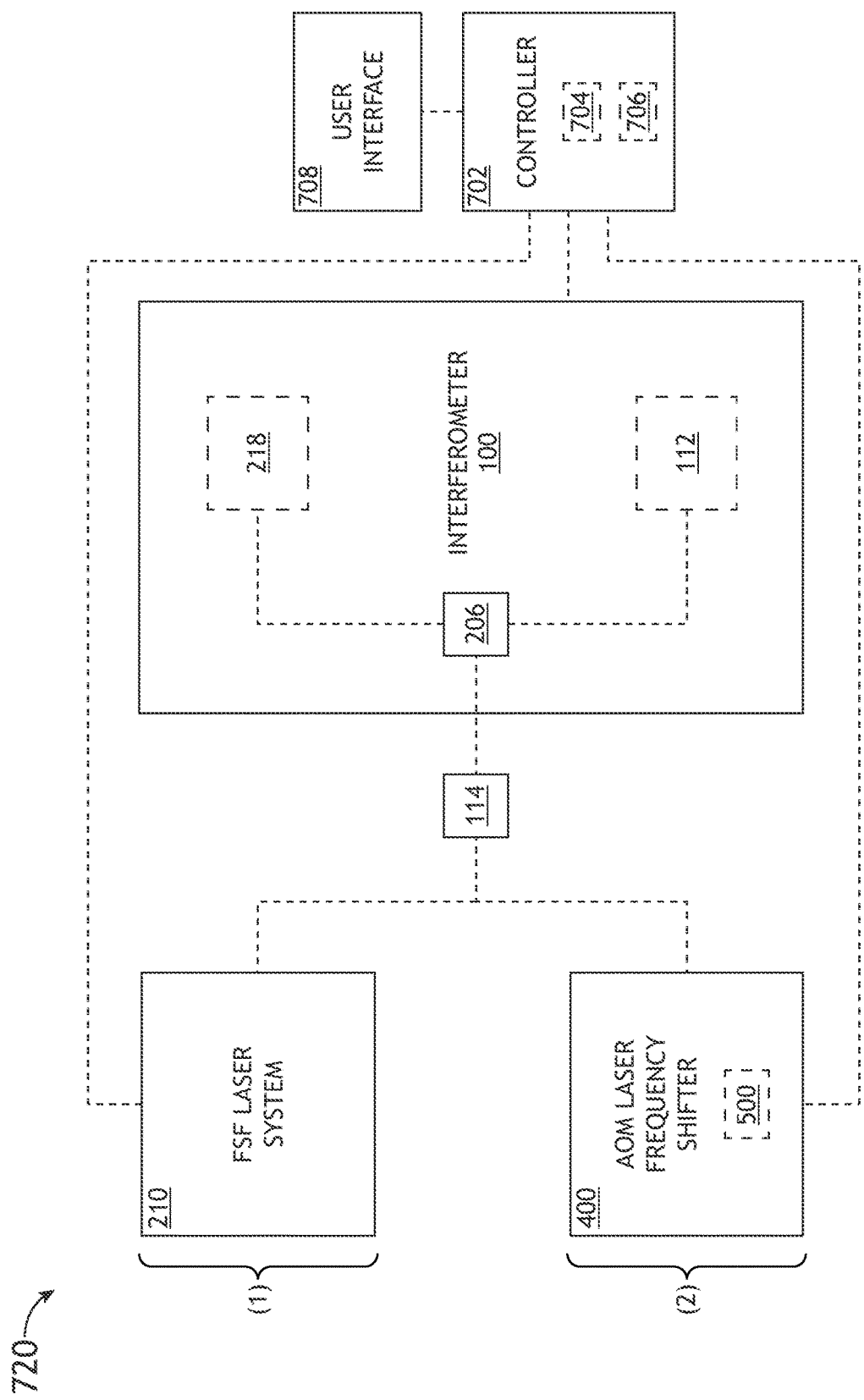
FIG. 7C is a simplified block diagram of a characterization system including an interferometer and an acousto-optic modulator laser frequency shifter system, in accordance with one or more embodiments of the present disclosure.

FIGS. 7A-7C in general illustrate example characterization systems for phase-shift interferometry, in accordance with one or more embodiments of the present disclosure.

Referring now to FIG. 7A, in one embodiment a characterization system 700 (e.g., a phase-shift interferometry system, or the like) includes the AOM laser frequency shifter system 400, the interferometer 600, and a controller 702. In another embodiment, the AOM laser frequency shifter system 400 is coupled (e.g., optically, physically, electrically, and/or communicatively) to the interferometer 600. For example, the optical coupler 114 of the AOM laser frequency shifter system 400 may be coupled to the optical coupler 114 of the interferometer 600. It is noted herein the AOM laser frequency shifter system 400 may be as illustrated in FIG. 4 or may include the subsystem 500 as illustrated in FIG. 5A or 5B.

Referring now to FIG. 7B, in one embodiment a characterization system 710 (e.g., a phase-shift interferometry system) includes the AOM laser frequency shifter system 400, the interferometer 100, and the controller 702. In another embodiment, the AOM laser frequency shifter system 400 is coupled (e.g., optically, physically, electrically, and/or communicatively) to the interferometer 100. For example, the optical coupler 114 of the AOM laser frequency shifter system 400 may be coupled to the optical coupler 114 of the interferometer 100. It is noted herein the AOM laser frequency shifter system 400 may be as illustrated in FIG. 4 or may include the subsystem 500 as illustrated in FIG. 5A or 5B.

Referring now to FIG. 7C, in one embodiment a characterization system 720 (e.g., a phase-shift interferometry system) includes the FSF laser system 210, the AOM laser frequency shifter system 400, the interferometer 100, and the controller 702. It is noted herein the AOM laser frequency shifter system 400 may be as illustrated in FIG. 4 or may include the subsystem 500 as illustrated in FIG. 5A or 5B.

In another embodiment, the FSF laser system 210 is first coupled to the interferometer 100. In this embodiment, the mirror 218 is installed within the interferometer 100. For example, the optical difference in the interferometer 100 is measured with the FSF laser system 210 and the mirror 218. It is noted herein this embodiment is marked with a (1) in FIG. 7C.

In another embodiment, the FSF laser system 210 is uncoupled from the interferometer 100 and the AOM laser frequency shifter system 400 is next coupled to the interferometer 100. In this embodiment, the sensor 112 is swapped into the interferometer 100 in place of the mirror 218. It is noted herein this embodiment is marked with a (2) in FIG. 7C.

Although not shown, it should be understood a FSF laser system 210 may be coupled to the interferometer 600 (e.g., for purposes of measuring the OPL of the test path 102 and/or the reference path 104), such that the sensor 112 of the interferometer 600 may be switched with a mirror 218 when the FSF laser system 210 is first coupled to the interferometer 600 prior to the AOM laser frequency shifter system 400 being coupled to the interferometer 600. Therefore, the above description should not be interpreted as a limitation on the scope of the present disclosure but merely an illustration.

Although embodiments of the disclosure illustrate a shared controller 702, it is noted herein the AOM laser frequency shift system 400 and/or the FSF laser system 210 may be coupled to a different controller 702 (or controllers 702) than the controller 702 coupled to the interferometer 100 or the interferometer 600. Therefore, the above description should not be interpreted as a limitation on the scope of the present disclosure but merely an illustration.

Although embodiments of the present disclosure illustrate shared optical couplers 114, it is noted herein the optical couplers 114 may be optical coupler assemblies with interlocking components, with each of the systems 200, 400, 600 including a component of the interlocking components of the optical coupler assemblies. Therefore, the above description should not be interpreted as a limitation on the scope of the present disclosure but merely an illustration.

Referring again to the example 6+1 symmetrical phase-shift algorithm, the algorithm is insensitive to sensor non-linearity and phase step errors. With a fast camera (e.g., >10 kiloframes-per-second (kfps)) and using the AOM laser frequency shifter system 400 to do the phase-shift process, one can perform multiple step phase-shift wavefront measurements (e.g., N≥3) in a time window of a few ms or sub-ms. With environment controls, the influences on $\varphi_0$ from system thermal drift, mechanical vibration, acoustic noise, and air wiggle are expected to be minor in such a short time window. In addition, averaging wavefront results of multiple fast measurements will improve the accuracy further. For example, for a wavefront measurement process lasting a select time period (e.g., a few minutes), a femtosecond laser may be used to monitor the OPD drift and the driving RF frequency will be tuned correspondingly to reach the target phase-shift steps.

In another embodiment, as illustrated in FIGS. 7A-7C, the controller 702 is coupled (e.g., physically, electrically, and/or communicatively) to the interferometer 100, the interferometer 600, and/or the AOM laser frequency shifter system 400; and/or components of the interferometer 100, the interferometer 600, and/or the AOM laser frequency shifter system 400. For example, the controller 702 may be coupled to a holding mechanism or sample stage, actuators for the holding mechanism or the sample stage, sensors, installed optics, incident light sources, the wave generator 302, optics controlling the one or more phase-shift channels 402, or other components within the interferometer 100, the interferometer 600, and/or the AOM laser frequency shifter system 400.

In embodiments, the one or more processors 704 of the controller 702 may be configured to execute a set of program instructions stored in memory 706, the set of program instructions configured to cause the one or more processors to carry out various steps and processes of the present disclosure. In another embodiment, a user interface 708 is coupled (e.g., physically, electrically, and/or communicatively) to the controller 702.

It is noted herein that the one or more components of the controller 702 and the interferometer 100 may be communicatively coupled to the various other components of the system in any manner known in the art. For example, the controller 702 and the interferometer 100 may be communicatively coupled to each other and other components via a wireline (e.g., copper wire, fiber optic cable, and the like) or wireless connection (e.g., RF coupling, IR coupling, data network communication (e.g., WiFi, WiMax, 3G, 4G, 4G LTE, 5G, Bluetooth, and the like).

In one embodiment, the one or more processors 704 may include any one or more processing elements known in the art. In this sense, the one or more processors 704 may include any microprocessor-type device configured to execute software algorithms and/or instructions. In one embodiment, the one or more processors 704 may consist of a desktop computer, mainframe computer system, workstation, image computer, parallel processor, or other computer system (e.g., networked computer) configured to execute a program configured to operate the interferometer 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 704. In general, the term "processor" may be broadly defined to encompass any device having one or more processing elements, which execute program instructions from memory 706. Moreover, different subsystems of the interferometer 100 (e.g., illumination source 110, FSF laser system 210, AOM laser frequency shifter system 400, sensor 112, controller 702, user interface 708) may include processor or logic elements suitable for carrying out at least a portion of the steps described throughout the present disclosure. Therefore, the above description should not be interpreted as a limitation on the present disclosure but merely an illustration.

The memory 706 may include any storage medium known in the art suitable for storing program instructions executable by the associated one or more processors 704 and the data received/generated by the interferometer 100. For example, the memory 706 may include a non-transitory memory medium. For instance, the memory 706 may include, but is not limited to, a read-only memory (ROM), a random-access memory (RAM), a magnetic or optical memory device (e.g., disk), a magnetic tape, a solid-state drive and the like. It is further noted that memory 706 may be housed in a common controller housing with the one or more processors 704. In an alternative embodiment, the memory 706 may be located remotely with respect to the physical location of the processors 704 and controller 702. In another embodiment, the memory 706 maintains program instructions for causing the one or more processors 704 to carry out the various steps described through the present disclosure.

In one embodiment, a user interface 708 is communicatively coupled to the controller 702. In one embodiment, the user interface 708 may include, but is not limited to, one or more desktops, tablets, smartphones, smart watches, or the like. In another embodiment, the user interface 708 includes a display used to display data of the interferometer 100 to a user. The display of the user interface 708 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 708 is suitable for implementation in the present disclosure. In another embodiment, a user may input selections and/or instructions responsive to data displayed to the user via the user interface 708.

Figure 8A:
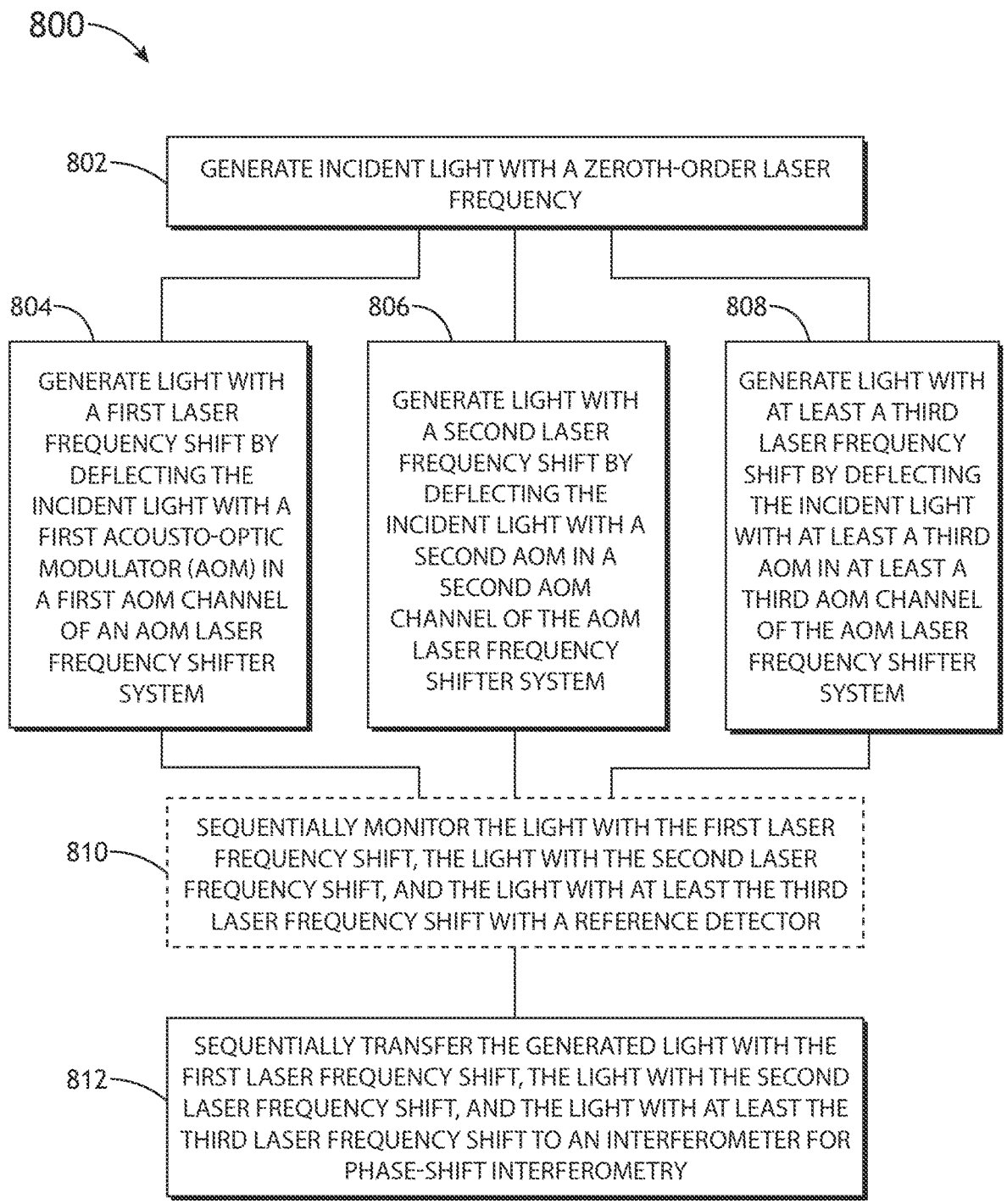
FIG. 8A is a flow diagram illustrated a method or process for laser frequency shifting with an acousto-optic modulator, in accordance with one or more embodiments of the present disclosure.
Figure 8B:
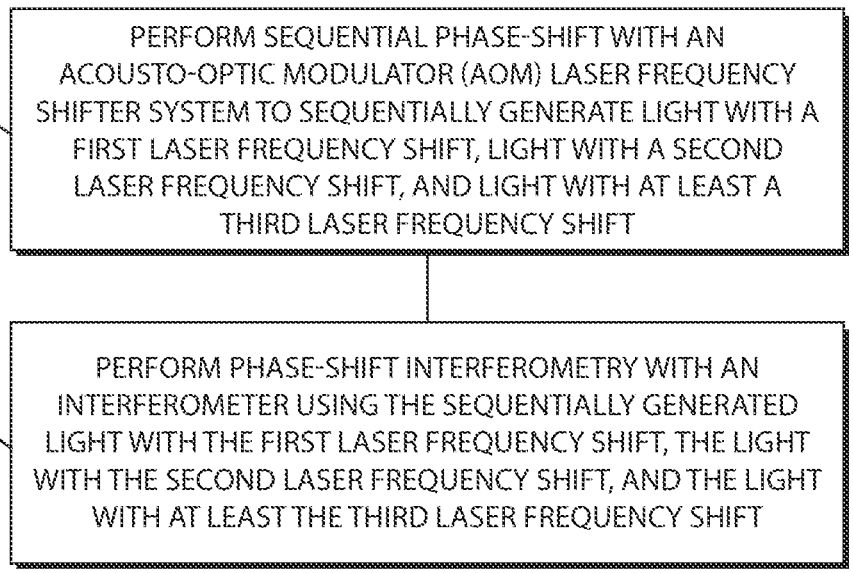
FIG. 8B is a flow diagram illustrated a method or process for interferometry with an acousto-optic modulator, in accordance with one or more embodiments of the present disclosure.
Figure 8C:
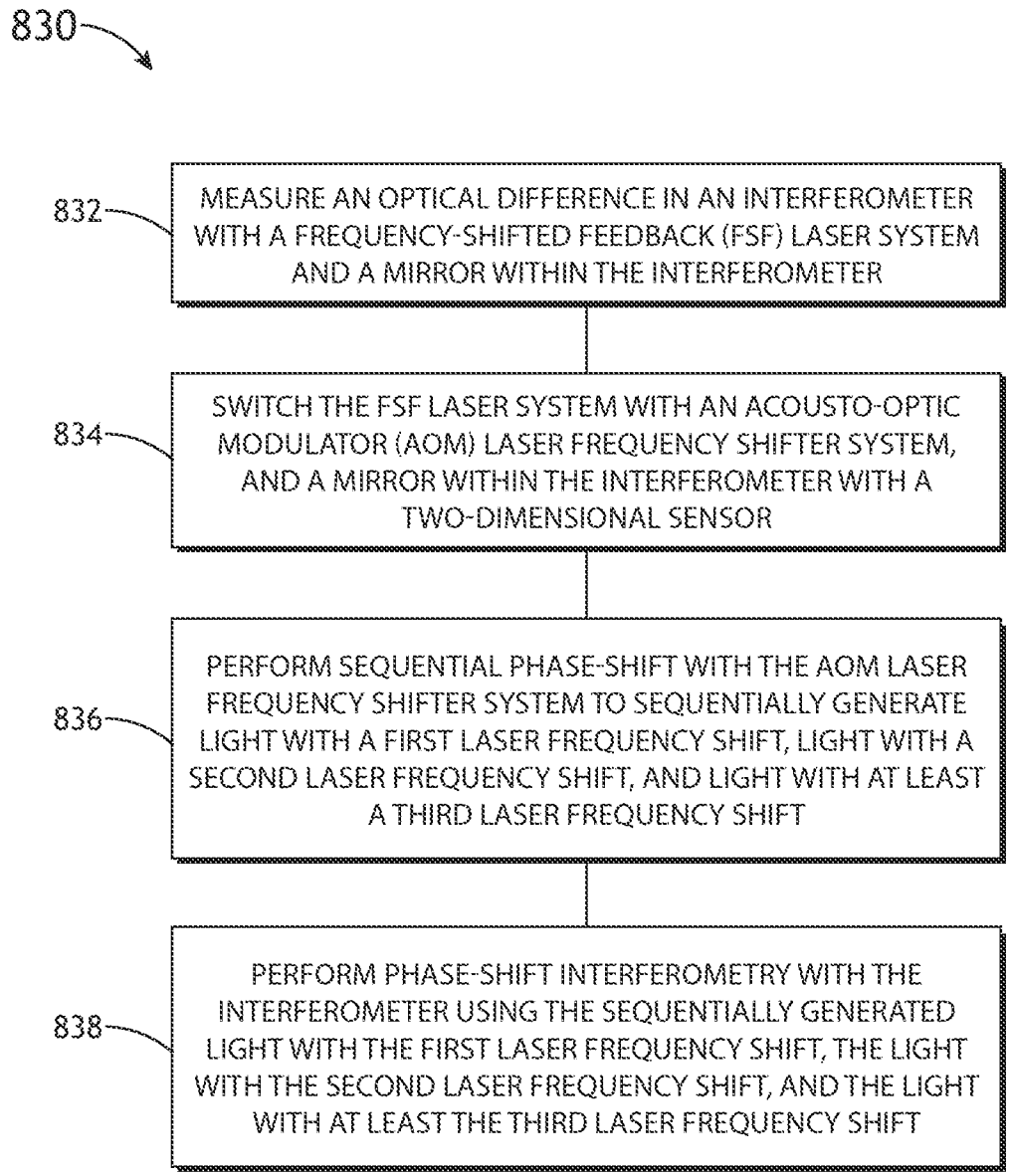
FIG. 8C is a flow diagram illustrated a method or process for interferometry with an acousto-optic modulator, in accordance with one or more embodiments of the present disclosure.

In another embodiment, the one or more processors 704 of the controller 702 is configured to perform one or more steps of the following methods or processes, as illustrated in FIGS. 8A-8C:

FIG. 8A illustrates a method or process 800 for generating laser frequency-shifted light, in accordance with one or more embodiments of the present disclosure. It is noted herein that the steps of method or process 800 may be implemented all or in part by the interferometer 100 or the interferometer 600. It is further recognized, however, that the method or process 800 is not limited to the interferometer 100 or the interferometer 600 in that additional or alternative system-level embodiments may carry out all or part of the steps of method or process 800.

In a step 802, incident light is generated with a zeroth-order laser frequency. In one embodiment, the incident light is generated by the laser 404. In another embodiment, the incident light is transmitted through the optical splitter 406.

In a step 804, light with a first laser frequency shift is generated by deflecting the incident light with a first AOM in a first AOM channel of an AOM laser frequency shifter system. In one embodiment, the optical splitter 406 directs the incident light to the first AOM channel 402. In another embodiment, the first AOM channel 402 is active, and the incident light passes through the first AOM 300. In another embodiment, the AOM generates an acoustic wave based on a RF wave f from the wave generator 302. In another embodiment, the first AOM 300 deflects the incident light to generate light with the first laser frequency shift. In another embodiment, the light with the first laser frequency shift enters the optical splitter 408.

In a step 806, light with a second laser frequency shift is generated by deflecting the incident light with a second AOM in a second AOM channel of the AOM laser frequency shifter system. In one embodiment, the optical splitter 406 directs the incident light to the second AOM channel 402. In another embodiment, the second AOM channel 402 is active, and the incident light passes through the second AOM 300. In another embodiment, the second AOM 300 deflects the incident light to generate light with the second laser frequency shift. In another embodiment, the light with the second laser frequency shift enters the optical splitter 408.

In a step 808, light with at least a third laser frequency shift is generated by deflecting the incident light with at least a third AOM in at least a third AOM channel of the AOM laser frequency shifter system. In one embodiment, the optical splitter 406 directs the incident light to the third AOM channel 402. In another embodiment, the third AOM channel 402 is active, and the incident light passes through the third AOM 300. In another embodiment, the third AOM 300 deflects the incident light to generate light with the third laser frequency shift. In another embodiment, the light with the third laser frequency shift enters the optical splitter 408.

It is noted herein steps 804, 806, 808 may be performed sequentially, such that only one AOM channel 402 is active at a time. In addition, it is noted herein laser frequency shift generated by the AOM channels 402 may sequentially increase in either even or uneven intervals, as described above.

It is noted herein the optical splitter 406 may be configured to direct the incident light to all AOM channels 402 simultaneously, or may be configured to direct the incident light only to the turned-on or active AOM channel 402. In addition, it is noted herein the optical splitter 408 may be configured to receive the beams with the laser frequency shift simultaneously, or may be configured to receive the beam with the laser frequency shift only from the turned-on or active AOM channel 402. Therefore, the above description should not be interpreted as a limitation on the scope of the present disclosure but merely an illustration.

In a step 810, the light with the first laser frequency shift, the light with the second laser frequency shift, and the light with at least the third laser frequency shift is sequentially monitored with a reference detector. In one embodiment, a portion of the light (or lights) with the laser frequency shift is split to the reference detector 506. For example, the beam splitter 504 may split the portion of the light (or lights) with the laser frequency shift to the reference detector 506.

In a step 812, the light with the first laser frequency shift, the light with the second laser frequency shift, and the light with at least the third laser frequency shift is sequentially transferred to an interferometer for phase-shift interferometry.

FIG. 8B illustrates a method or process 820 for generating laser frequency-shifted light, in accordance with one or more embodiments of the present disclosure. It is noted herein that the steps of method or process 820 may be implemented all or in part by the interferometer 100 or the interferometer 600. It is further recognized, however, that the method or process 820 is not limited to the interferometer 100 or the interferometer 600 in that additional or alternative system-level embodiments may carry out all or part of the steps of method or process 820.

In a step 822, sequential phase-shift with an AOM laser frequency shifter system is performed to sequentially generate light with a first laser frequency shift, light with a second laser frequency shift, and light with at least a third laser frequency shift. In one embodiment, one or more steps of the method or process 800 are performed for the sequential phase-shift.

In a step 824, phase-shift interferometry with an interferometer using the sequentially-generated light is performed with the first laser frequency shift, the light with the second laser frequency shift, and the light with at least the third laser frequency shift. For example, the one or more processors 704 of the controller 702 may be configured to: receive one or more acquired interferograms from the interferometer 100 or 600; and generate one or more surface height or surface slope maps from surface height measurements or surface slope measurements within the one or more acquired interferograms. It is noted herein that the controller 702 may be configured to receive one or more interferometers from any source known in the art. Accordingly, the controller 702 may be configured to receive interferometers from sources other than the inspection sub-system 102 including, but not limited to, memory 706, an external storage device, a network, and the like.

FIG. 8C illustrates a method or process 830 for generating laser frequency-shifted light, in accordance with one or more embodiments of the present disclosure. It is noted herein that the steps of method or process 830 may be implemented all or in part by the interferometer 100 or the interferometer 600. It is further recognized, however, that the method or process 830 is not limited to the interferometer 100 or the interferometer 600 in that additional or alternative system-level embodiments may carry out all or part of the steps of method or process 830.

In a step 832, an optical path difference between test and reference paths in an interferometer is measured with a FSF laser system and a mirror within the interferometer. In one embodiment, the FSF laser system 210 is used to measure the OPL of the test path 102 and/or the reference path 104 of the interferometer 100 or the interferometer 600. For example, where the OPL of both are measured, the test path 102 and the reference path 104 are measured separately and in turn.

In a step 834, the FSF laser system with an AOM laser frequency shifter system is switched, and a mirror within the interferometer with a two-dimensional sensor is switched. In one embodiment, the FSF laser system 210 is uncoupled from the interferometer 100 or the interferometer 600, and the AOM laser frequency shifter system 400 is coupled to the interferometer 100 or the interferometer 600. In another embodiment, the mirror 218 within the interferometer 100 or the interferometer 600 is switched with the sensor 112.

In a step 836, sequential phase-shift with the AOM laser frequency shifter system is performed to sequentially generate light with a first laser frequency shift, light with a second laser frequency shift, and light with at least a third laser frequency shift. In one embodiment, one or more steps of the method or process 800 are performed for the sequential phase-shift.

In a step 838, phase-shift interferometry is performed with the interferometer using the sequentially-generated light with the first laser frequency shift, the light with the second laser frequency shift, and the light with at least the third laser frequency shift. For example, the one or more processors 704 of the controller 702 may be configured to: receive one or more acquired interferograms from the interferometer 100 or 600; and generate one or more surface height or surface slope maps from surface height measurements or surface slope measurements within the one or more acquired interferograms. It is noted herein that the controller 702 may be configured to receive one or more interferometers from any source known in the art. Accordingly, the controller 702 may be configured to receive interferometers from sources other than the inspection sub-system 102 including, but not limited to, memory 706, an external storage device, a network, and the like.

Although embodiments of the present disclosure illustrate the optical coupling and uncoupling of the FSF laser system 210 and the AOM laser frequency shifter system 400, it is noted herein the characterization system 700 may include optical components arranged to allow for the installation of both the FSF laser system 210 and the AOM laser frequency shifter system 400, such that the optical coupling and uncoupling of the FSF laser system 210 and the AOM laser frequency shifter system 400 is not required. In addition, it is noted herein the interferometer 100 and/or the interferometer 600 may include optical components arranged to allow for the installation of both the sensor 112 and the mirror 218, such that switching of the sensor 112 and the mirror 218 is not required. Therefore, the above description should not be interpreted as a limitation on the present disclosure but merely an illustration.

It is noted herein "light with a laser frequency shift" and "frequency-shifted beam" may be considered equivalent, for purposes of the present disclosure.

Although steps of the methods or processes 800, 820, 830 include sequential operation (e.g., sequential phase-shifting, sequential monitoring, or the like), it is noted herein sequential operations are not necessary where there is only one frequency-shifted beam. Therefore, the above description should not be interpreted as a limitation on the scope of the disclosure but merely an illustration.

It is noted herein the methods or processes 800, 820, 830 is not limited to the steps and/or sub-steps provided. The methods or processes 800, 820, 830 may include more or fewer steps and/or sub-steps. For example, step 810 may be optional where the subsystem 500 is not installed within the AOM laser frequency shifter system 400. In addition, the methods or processes 800, 820, 830 may perform the steps and/or sub-steps simultaneously. Further, the methods or processes 800, 820, 830 may perform the steps and/or sub-steps sequentially, including in the order provided or an order other than provided. Therefore, the above description should not be interpreted as a limitation on the scope of the disclosure but merely an illustration.

All of the methods or processes described herein may include storing results of one or more steps of the method or process embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be RAM, and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

In this regard, advantages of the present disclosure include performing multiple step (e.g., N≥3) phase-shift interferometry in a time period of a few ms or sub-ms by using AOM laser frequency shifters, greatly reducing the influences of thermal drift, mechanical vibration, acoustic noise, and air wiggle. Advantages of the present disclosure also include reaching an accuracy of phase shift better than $10^{-5}$ wave in a broad wavelength range between DUV and IR, which is not feasible with traditional phase-shift methods such as using a PZT. Advantages of the present disclosure also include measuring the OPD between the test and reference paths in an interferometer to an accuracy about 1 micron by using laser frequency comb technology such as a frequency-shifted feedback laser.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are in general intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An acousto-optic modulator (AOM) laser frequency shifter system, comprising:
    a laser configured to generate an incident beam;
    a first optical splitter optically coupled to the laser, wherein the first optical splitter is configured to split the incident beam into at least one portion of the incident beam;
    at least one phase-shift channel optically coupled to the first optical splitter, wherein the at least one phase-shift channel includes an AOM, wherein the at least one phase-shift channel is configured to receive the at least one portion of the incident beam, wherein the AOM is configured to generate at least one frequency-shifted beam from the at least one portion of the incident beam; and
    a second optical splitter configured to receive the at least one frequency-shifted beam from the at least one phase-shift channel, wherein the second optical splitter is configured to direct the at least one frequency-shifted beam to an interferometer configured to acquire an interferogram of a sample with the at least one frequency-shifted beam, wherein the interferometer comprises one or more optical paths leading to a sensor, wherein an optical path of the one or more optical paths including a set of test optics, wherein the set of test optics include the sample; and
    a frequency-shifted feedback (FSF) laser system, wherein the FSF laser system is optically coupled to the interferometer to measure an optical path length of the one or more optical paths, wherein the FSF laser system is uncoupled from the interferometer after measuring the optical path length of the one or more optical paths, wherein the AOM laser frequency shifter system is optically coupled to the interferometer after the FSF laser system is uncoupled.

2. The AOM laser frequency shifter system of claim 1, wherein the at least one phase-shift channel and the at least one frequency-shifted beam includes a first phase-shift channel configured to receive a first portion of the incident beam, a second phase-shift channel configured to receive a second portion of the incident beam, and at least a third phase-shift channel configured to receive at least a third portion of the incident beam.

3. The AOM laser frequency shifter system of claim 2, wherein the first phase-shift channel is configured to generate a first frequency-shifted beam from the first portion of the incident beam, wherein the second phase-shift channel is configured to generate a second frequency-shifted beam, wherein the at least the third phase-shift channel is configured to generate at least a third frequency-shifted beam.

4. The AOM laser frequency shifter system of claim 1, wherein a frequency of the at least one phase-shift channel is tunable.

5. The AOM laser frequency shifter system of claim 1, further comprising:
    a reference detector optically coupled between the second optical splitter and the interferometer, wherein the reference detector is configured to monitor the at least one frequency-shifted beam for power fluctuations in the incident beam.

6. A method comprising:
    generating an incident beam with a laser source;
    splitting the incident beam into at least one portion of the incident beam with a first optical splitter;
    directing the at least one portion of the incident beam into at least one phase-shift channel of an acousto-optic modulator (AOM) laser frequency shifter system with the first optical splitter;
    generating at least one frequency-shifted beam from the at least one portion of the incident beam with an AOM in the at least one phase-shift channel of the AOM laser frequency shifter system;
    receiving the at least one frequency-shifted beam with a second optical splitter;
    directing the at least one frequency-shifted beam via the second optical splitter to an interferometer configured to acquire an interferogram of a sample with the at least one frequency-shifted beam, wherein the interferometer comprises one or more optical paths leading to a sensor, wherein an optical path of the one or more optical paths including a set of test optics, wherein the set of test optics include the sample;
optically coupling a frequency-shifted feedback (FSF) laser system to the interferometer;
measuring an optical path length of the one or more optical paths with the FSF laser system;
uncoupling the FSF laser system from the interferometer; and
optically coupling the AOM laser frequency shifter system to the interferometer after the FSF laser system is uncoupled.

7. The method of claim 6, wherein the at least one phase-shift channel and the at least one frequency-shifted beam includes a first phase-shift channel configured to receive a first portion of the incident beam, a second phase-shift channel configured to receive a second portion of the incident beam, and at least a third phase-shift channel configured to receive at least a third portion of the incident beam.

8. The method of claim 7, wherein the first phase-shift channel is configured to generate a first frequency-shifted beam from the first portion of the incident beam, wherein the second phase-shift channel is configured to generate a second frequency-shifted beam, wherein the at least the third phase-shift channel is configured to generate at least a third frequency-shifted beam.

9. The method of claim 6, wherein a frequency of the at least one phase-shift channel is tunable.

10. The method of claim 6, further comprising:
monitoring the at least one frequency-shifted beam for power fluctuations in the incident beam via a reference detector optically coupled between the second optical splitter and the interferometer.

11. A characterization system comprising:
an interferometer configured to acquire an interferogram of a sample, wherein the interferometer comprises one or more optical paths leading to a sensor, wherein an optical path of the one or more optical paths including a set of test optics, wherein the set of test optics include the sample; and
an acousto-optic modulator (AOM) laser frequency shifter system optically coupled to the interferometer, wherein the AOM laser frequency shifter system comprises:
a laser configured to generate an incident beam;
a first optical splitter optically coupled to the laser, wherein the first optical splitter is configured to split the incident beam into at least one portion of the incident beam;
at least one phase-shift channel optically coupled to the first optical splitter, wherein the at least one phase-shift channel includes an AOM, wherein the at least one phase-shift channel is configured to receive the at least one portion of the incident beam, wherein the AOM is configured to generate at least one frequency-shifted beam from the at least one portion of the incident beam; and
a second optical splitter configured to receive the at least one frequency-shifted beam from the at least one phase-shift channel, wherein the second optical splitter is configured to direct the at least one frequency-shifted beam to the interferometer, wherein the interferometer is configured to acquire the interferogram of the sample with the at least one frequency-shifted beam; and a frequency-shifted feedback (FSF) laser system, wherein the FSF laser system is optically coupled to the interferometer to measure an optical path length of the one or more optical paths, wherein the FSF laser system is uncoupled from the interferometer after measuring the optical path length of the one or more optical paths, wherein the AOM laser frequency shifter system is optically coupled to the interferometer after the FSF laser system is uncoupled.

12. The characterization system of claim 11, wherein the at least one phase-shift channel and the at least one frequency-shifted beam includes a first phase-shift channel configured to receive a first portion of the incident beam, a second phase-shift channel configured to receive a second portion of the incident beam, and at least a third phase-shift channel configured to receive at least a third portion of the incident beam.

13. The characterization system of claim 12, wherein the first phase-shift channel is configured to generate a first frequency-shifted beam from the first portion of the incident beam, wherein the second phase-shift channel is configured to generate a second frequency-shifted beam, wherein the at least the third phase-shift channel is configured to generate at least a third frequency-shifted beam.

14. The characterization system of claim 11, wherein a frequency of the at least one phase-shift channel is tunable.

15. The characterization system of claim 11, further comprising:
a reference detector optically coupled between the second optical splitter and the interferometer, wherein the reference detector is configured to monitor the at least one frequency-shifted beam for power fluctuations in the incident beam.

16. The characterization system of claim 11, wherein the sensor is a two-dimensional sensor.

17. The characterization system of claim 11, wherein a mirror in installed within the interferometer when the FSF laser system is optically coupled to the interferometer, wherein the mirror is removed from the interferometer after measuring the optical path length of the one or more optical paths with the FSF laser system, wherein the sensor is installed in the interferometer when the AOM laser frequency shifter system is optically coupled to the interferometer after the FSF laser system is uncoupled.

18. A method, comprising:
generating an incident beam with a laser source;
splitting the incident beam into at least one portion of the incident beam with a first optical splitter;
directing the at least one portion of the incident beam into at least one phase-shift channel of an acousto-optic modulator (AOM) laser frequency shifter system with the first optical splitter;
generating at least one frequency-shifted beam from the at least one portion of the incident beam with an AOM in the at least one phase-shift channel of the AOM laser frequency shifter system;
receiving the at least one frequency-shifted beam with a second optical splitter;
directing the at least one frequency-shifted beam via the second optical splitter to an interferometer, wherein the interferometer comprises one or more optical paths leading to a sensor, wherein an optical path of the one or more optical paths including a set of test optics, wherein the set of test optics include a sample;
optically coupling a frequency-shifted feedback (FSF) laser system to the interferometer;

measuring an optical path length of the one or more optical paths with the FSF laser system;

uncoupling the FSF laser system from the interferometer;

optically coupling the AOM laser frequency shifter system to the interferometer after the FSF laser system is uncoupled; and acquiring an interferogram of the sample in the interferometer with the at least one frequency-shifted beam.

19. The method of claim 18, wherein the at least one phase-shift channel and the at least one frequency-shifted beam includes a first phase-shift channel configured to receive a first portion of the incident beam, a second phase-shift channel configured to receive a second portion of the incident beam, and at least a third phase-shift channel configured to receive at least a third portion of the incident beam.

20. The method of claim 19, wherein the first phase-shift channel is configured to generate a first frequency-shifted beam from the first portion of the incident beam, wherein the second phase-shift channel is configured to generate a second frequency-shifted beam, wherein the at least the third phase-shift channel is configured to generate at least a third frequency-shifted beam.

21. The method of claim 18, wherein a frequency of the at least one phase-shift channel is tunable.

22. The method of claim 18, further comprising:

monitoring the at least one frequency-shifted beam for power fluctuations in the incident beam via a reference detector optically coupled between the second optical splitter and the interferometer.

23. The method of claim 18, wherein the sensor is a two-dimensional sensor.

24. The method of claim 18, further comprising:

installing a mirror within the interferometer when the FSF laser system is optically coupled to the interferometer;

removing the mirror from the interferometer after measuring the optical path length of the one or more optical paths with the FSF laser system; and installing the sensor in the interferometer when the AOM laser frequency shifter system is optically coupled to the interferometer after the FSF laser system is uncoupled.

* * * * *